(12) United States Patent
Moore et al.

(10) Patent No.: US 12,303,957 B2
(45) Date of Patent: May 20, 2025

(54) EXTRUDED HEAT PIPE

(71) Applicant: Intel Corporation, Santa Clara, CA (US)

(72) Inventors: Christopher Michael Moore, Hillsboro, OR (US); Curtis Koepsell, Beaverton, OR (US); Juha Tapani Paavola, Hillsboro, OR (US); Monica Maria Conejo Herrera, Alajuela (CR); Luis Diego Jimenez Sanchez, San Pedro (CR)

(73) Assignee: Intel Corporation, Santa Clara, CA (US)

( * ) Notice: Subject to any disclaimer, the term of this patent is extended or adjusted under 35 U.S.C. 154(b) by 1057 days.

(21) Appl. No.: 17/006,721

(22) Filed: Aug. 28, 2020

(65) Prior Publication Data

US 2020/0391266 A1    Dec. 17, 2020

(51) Int. Cl.
*B21C 23/10*   (2006.01)
*B21C 23/08*   (2006.01)
*H05K 7/20*    (2006.01)

(52) U.S. Cl.
CPC ....... *B21C 23/085* (2013.01); *H05K 7/20254* (2013.01); *H05K 7/20336* (2013.01); *H05K 7/20509* (2013.01)

(58) Field of Classification Search
CPC ..... B21C 23/085; B21C 23/10; B21C 23/217; B21C 35/023; B21C 35/026; B21C 37/0807; B21D 51/14; B21D 51/2669; B21D 53/06; H05K 7/20254; H05K 7/20336; H05K 7/20509

USPC ........... 72/254, 257, 260, 370.16; 29/890.05, 29/890.053
See application file for complete search history.

(56) References Cited

U.S. PATENT DOCUMENTS

| | | | | |
|---|---|---|---|---|
| 2,347,957 A | * | 5/1944 | McCullough | F28F 1/16 165/172 |
| 3,333,317 A | * | 8/1967 | Shockley | B21C 23/10 29/890.07 |
| 3,508,508 A | * | 4/1970 | Hill | F28F 1/16 72/370.16 |
| 3,680,189 A | * | 8/1972 | Noren | F28D 15/0283 29/890.032 |
| 3,731,517 A | * | 5/1973 | Johnson | B05B 1/20 72/370.23 |
| 4,936,503 A | * | 6/1990 | Hinds | B25B 11/007 72/370.04 |
| 6,508,302 B2 | * | 1/2003 | Ishida | F28D 15/0233 165/104.21 |
| 7,275,409 B1 | * | 10/2007 | Wu | F28D 15/0283 29/890.032 |

(Continued)

OTHER PUBLICATIONS

JP 60-082218A, Sugino May 1985.*

(Continued)

*Primary Examiner* — Edward T Tolan
(74) *Attorney, Agent, or Firm* — Alliance IP, LLC

(57) ABSTRACT

Metal is extruded through a feeder plate and an extrusion die to form a heat pipe component that includes a length of pipe and a flange extending outward from the pipe along the length of the pipe. A section of the flange is removed from the extruded heat pipe component, the pipe is sealed and compressed to reduce its thickness and form a heat pipe element for a computing system.

14 Claims, 24 Drawing Sheets

(56) References Cited

U.S. PATENT DOCUMENTS

| | | | | |
|---|---|---|---|---|
| 8,196,301 | B2* | 6/2012 | Yang | F28D 15/0233 |
| | | | | 29/890.038 |
| 9,568,254 | B2* | 2/2017 | Huang | F28D 15/0275 |
| 10,088,242 | B1* | 10/2018 | Rivera | F28D 15/0275 |
| 2008/0115553 | A1* | 5/2008 | Brochheuser | B21C 37/16 |
| | | | | 72/283 |
| 2012/0222839 | A1* | 9/2012 | Huang | F28D 15/0275 |
| | | | | 165/104.26 |
| 2012/0227933 | A1* | 9/2012 | Chen | B21D 53/06 |
| | | | | 29/890.032 |

OTHER PUBLICATIONS

CN107027265a, Lin et al. Aug. 2017.*
KR 20060129829A, Jang et al. Dec. 2006.*
WO 00/232,305, Bakker Apr. 2000.*
Davis, J.R. et al., "ASM Specialty Handbook, Copper and Copper Alloys, Forging and Extrusion," ASM International, ISBN 0-087170-726-8, (Aug. 2001) (pp. 213-221) (11 pages).
Murray, Andrew, "Variable Geometry Extrusion," YouTube, Uploaded on Jul. 30, 2015 by user: mechanicaldesign101, Time: 22 seconds; accessible at https://www.youtube.com/watch?v=VRC59iJjOwk, (1 page).

* cited by examiner

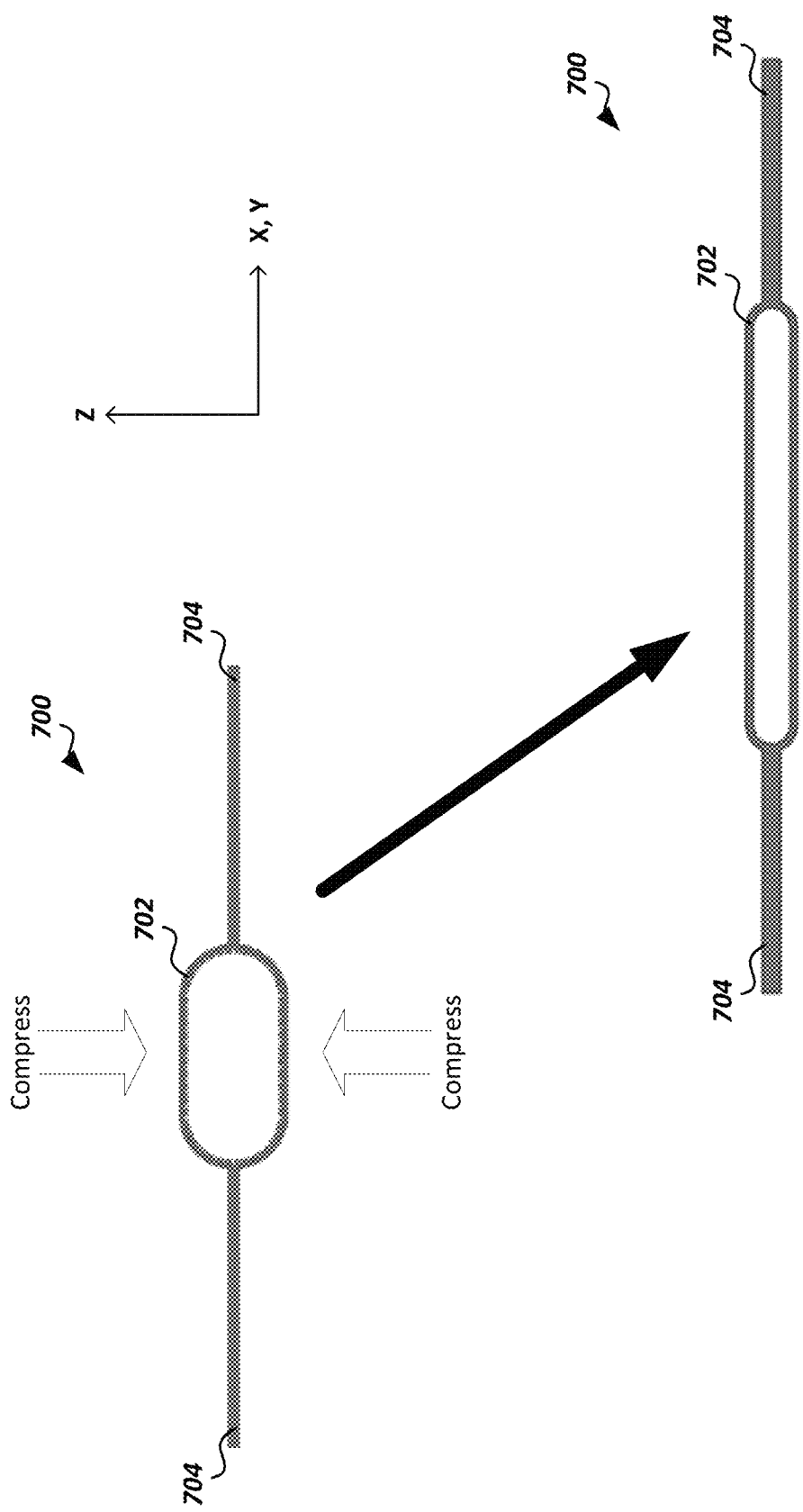

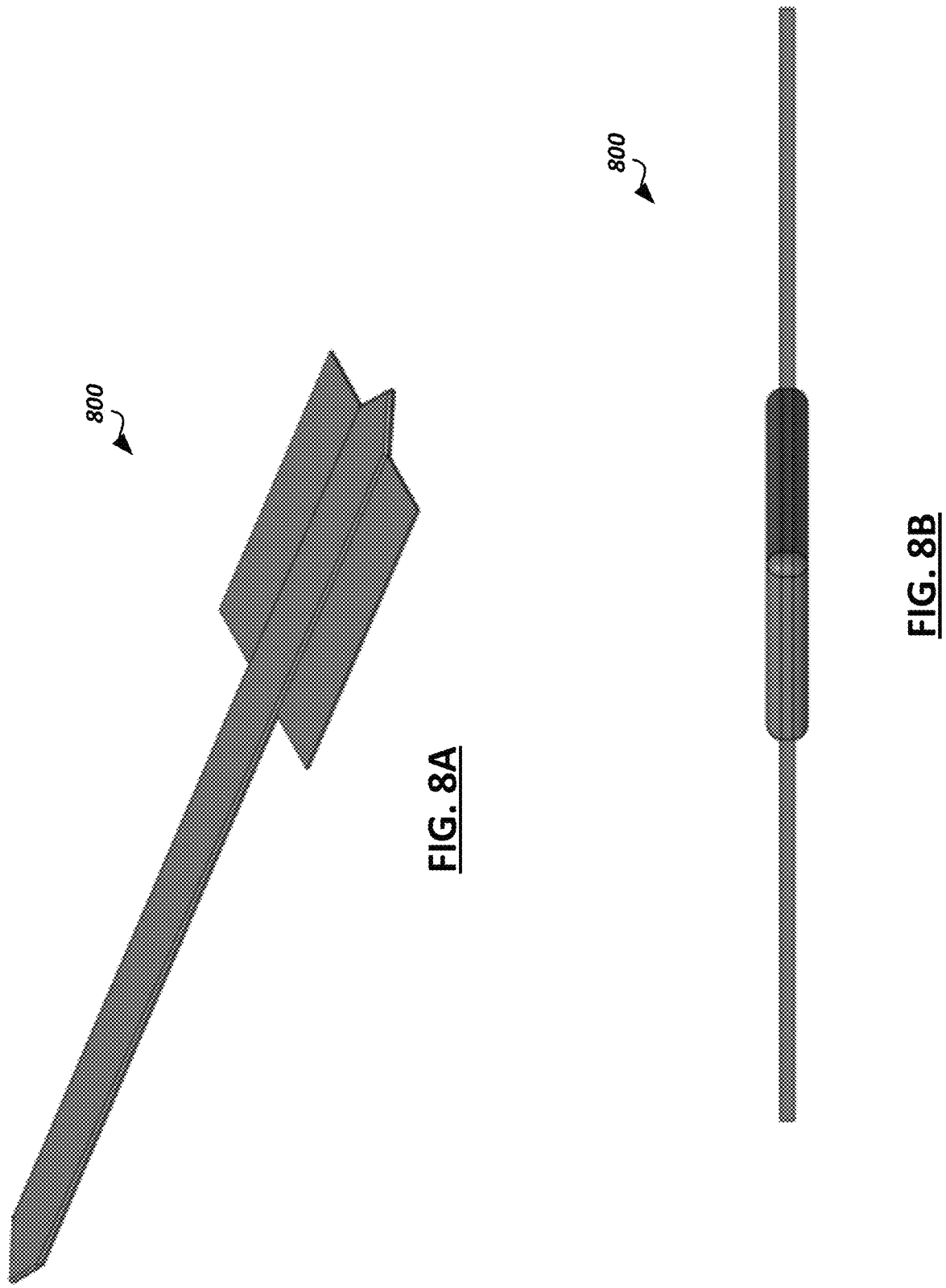

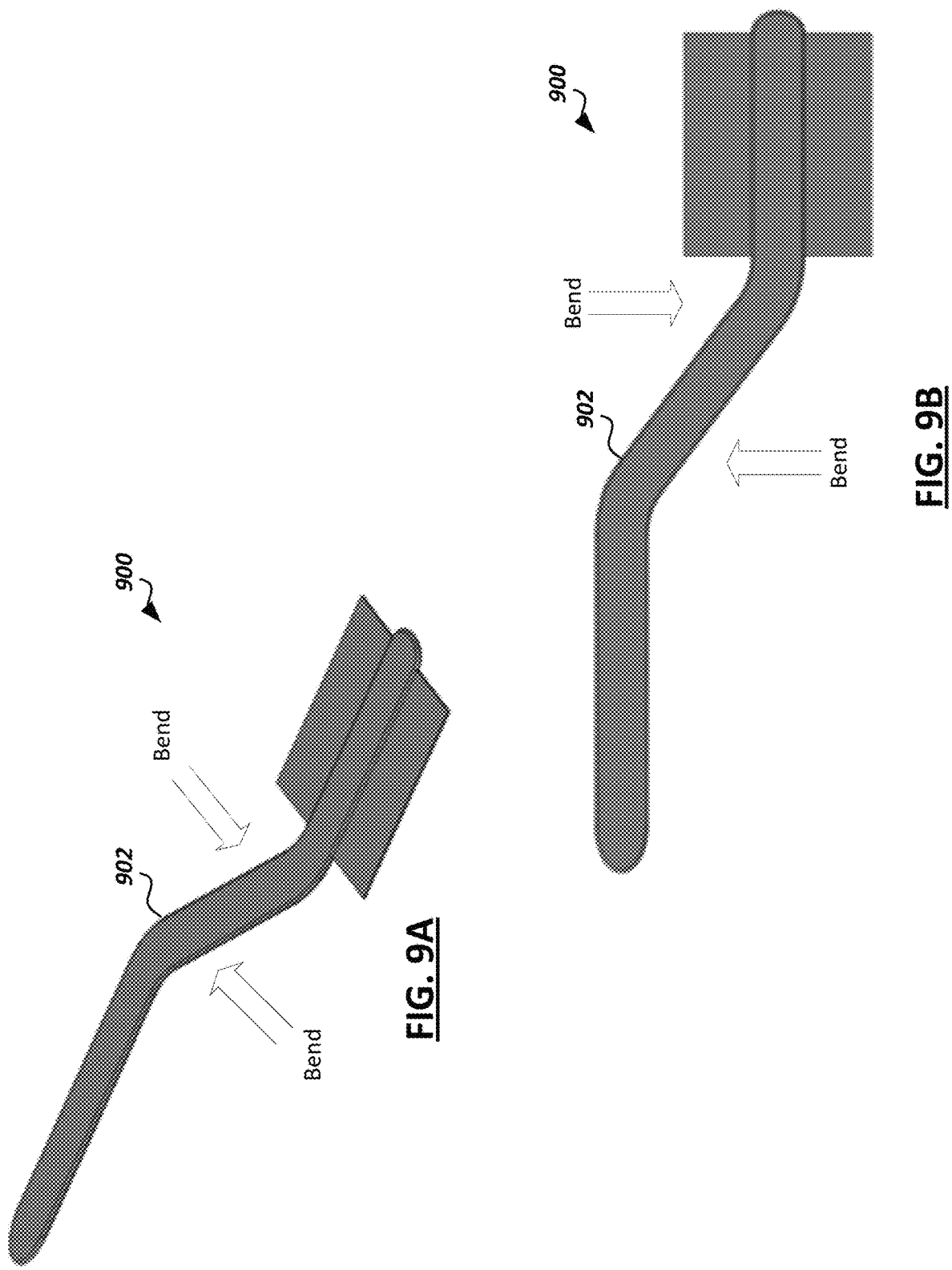

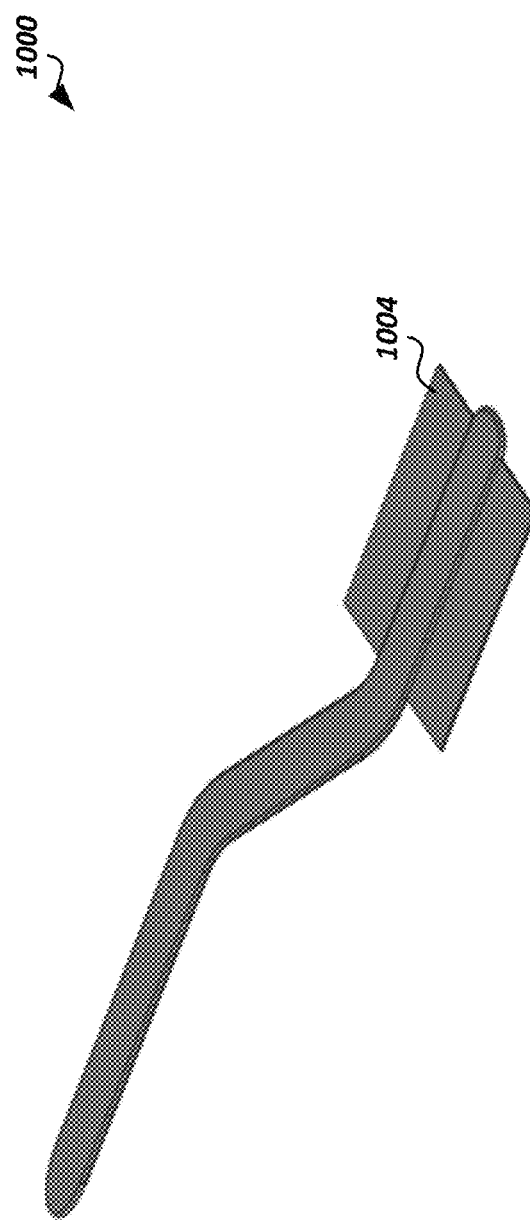
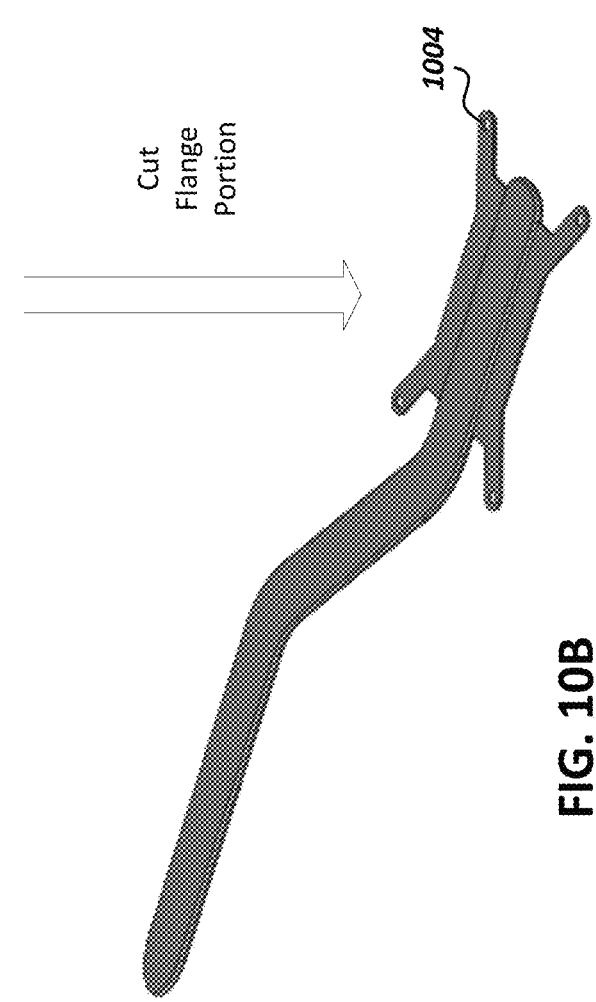
FIG. 10A
FIG. 10B

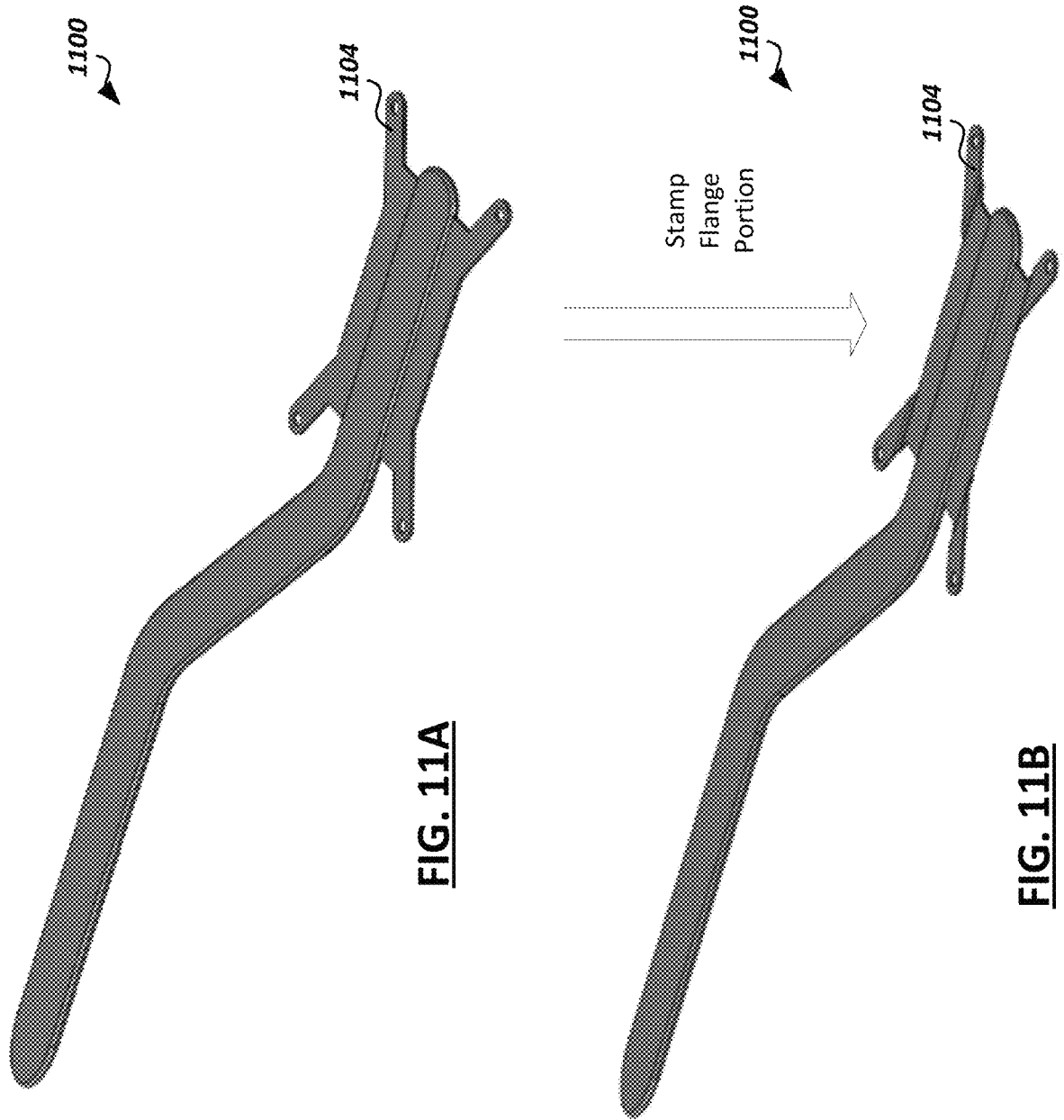

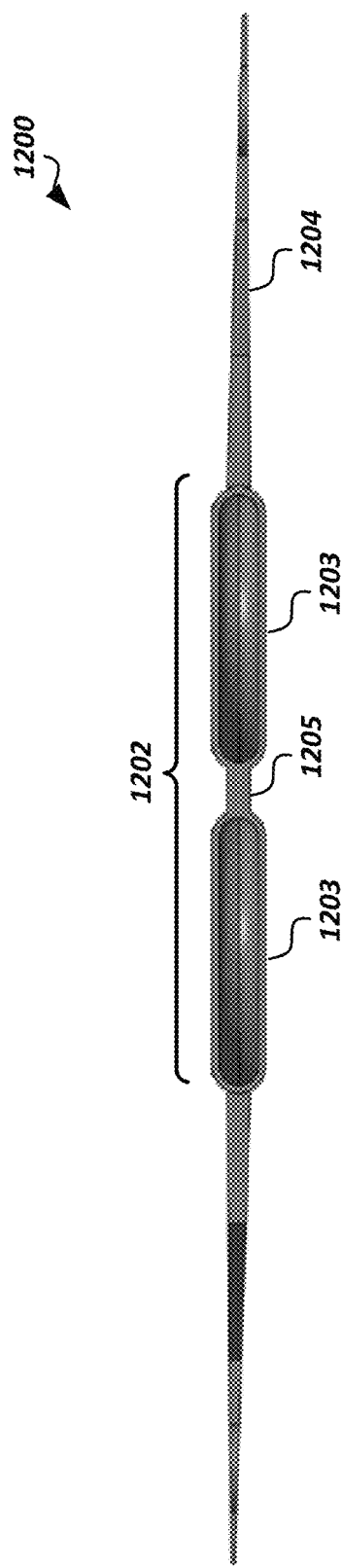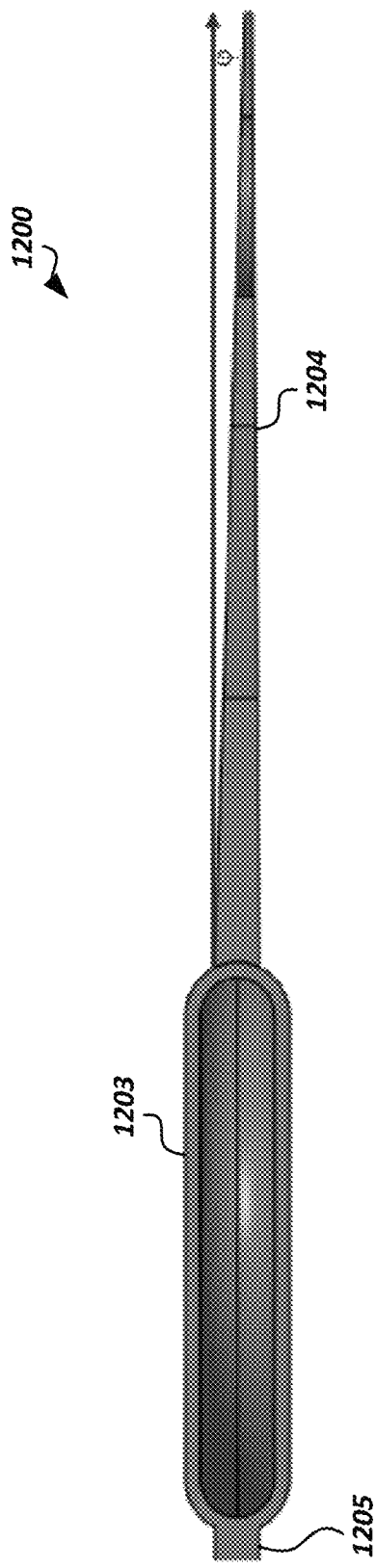
FIG. 12A
FIG. 12B

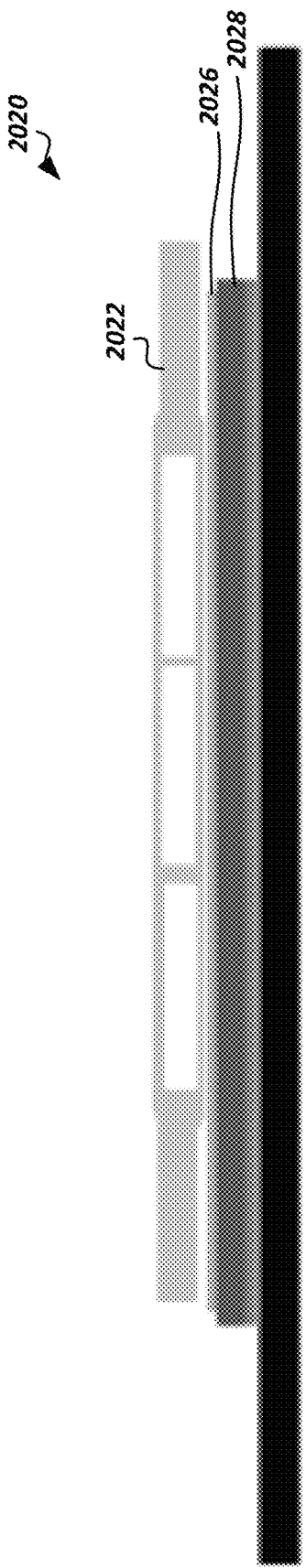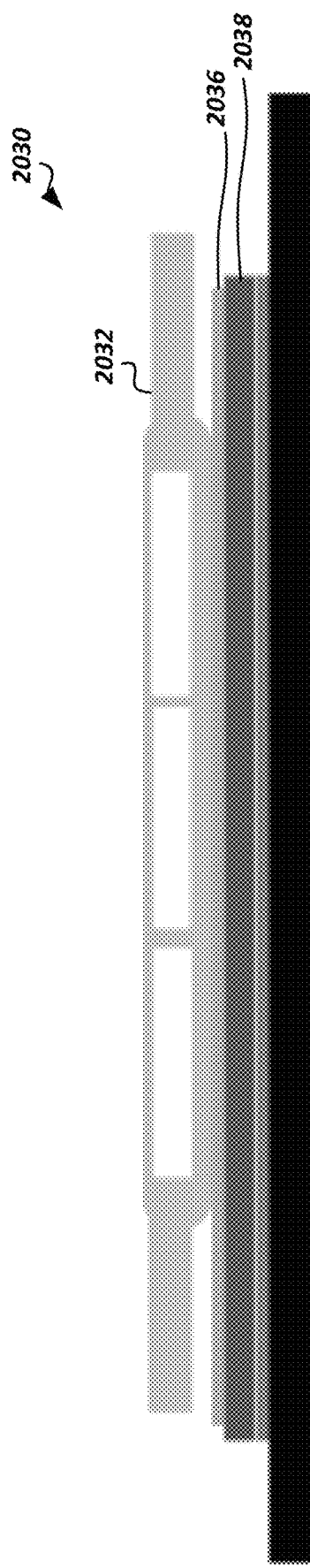

2104: 3 Heat pipes + 1mm cold plate (conventional design)

2108: 3 Heat Pipes using the extrusion process, no gap in between, no cold plate 2106: 3 Heat Pipes using the extrusion process with 0.2mm thicker wall, no gap in between, no cold plate 2102: No gap or solder between the heat pipes + 1mm cold plate

EXTRUDED HEAT PIPE

TECHNICAL FIELD

This disclosure relates in general to the field of computer systems and, more particularly, to computer cooling apparatuses that include heat pipes.

BACKGROUND

Computer systems may utilize heat pipes for thermal cooling of processors or chips containing processors (e.g., a system-on-chip (SoC) that includes a central processing unit (CPU), graphics processing unit (GPU), and/or another type of processor). Current heat pipe cooling systems may utilize heat pipes that are manufactured separately from the other portions of the cooling system, such as cold plates or connection mechanisms used to position the heat pipes with respect to a chip (e.g., SoC or processor chip) such that the heat pipes may absorb heat emitted from the chip. Because of this, the heat pipe must be coupled to these other mechanisms in some way (e.g., with solder), providing multiple potential points of failure in the cooling system.

BRIEF DESCRIPTION OF THE DRAWINGS

FIG. 7 is a diagram of showing an example cooling apparatus before and after heat pipe compression.

FIGS. 8A-8B are diagrams showing example views of the cooling apparatus of FIG. 5 after heat pipe sealing, charging, and compression.

FIGS. 9A-9B are diagrams showing example views of a cooling apparatus after heat pipe bending.

FIGS. 10A-10B are diagrams showing example views of a cooling apparatus after flange cutting.

FIGS. 11A-11B are diagrams showing example views of a cooling apparatus after flange stamping.

FIGS. 12A-12B are diagrams showing cross-sectional views of an example processor cooling apparatus with multiple heat pipes and tapered flanges.

FIGS. 20A-20D are diagrams showing views of different processor cooling apparatus embodiments with multiple heat pipes.

Like reference numbers and designations in the various drawings indicate like elements.

DETAILED DESCRIPTION OF EXAMPLE EMBODIMENTS

In the following description, numerous specific details are set forth, such as examples of specific configurations, structures, architectural details, etc. in order to provide a thorough understanding of the present disclosure. It will be apparent, however, to one skilled in the art that these specific details need not be employed to practice embodiments of the present disclosure. In some instances, well known components or methods may be utilized, and such details haven't been described in detail in order to avoid unnecessarily obscuring embodiments of the present disclosure.

Computer systems may utilize heat pipes for thermal cooling of processors or chips containing processors (e.g., a system-on-chip (SoC) that includes a central processing unit (CPU), graphics processing unit (GPU), and/or another type of processor). Current heat pipe cooling systems may utilize heat pipes that are manufactured separately from the other portions of the cooling system, such as cold plates or connection mechanisms used to position the heat pipes with respect to a chip (e.g., SoC or processor chip) such that the heat pipes may absorb heat emitted from the chip. Because of this, the heat pipe must be coupled to these other mechanisms in some way (e.g., with solder), providing multiple potential points of failure in the cooling system.

The present disclosure describes techniques for manufacturing heat pipes that avoid the need to couple the heat pipe to cold plates as in current systems, providing a robust means for heat pipe thermal solutions to be manufactured. A direct heat pipe attachment design, such as those described herein, has no separate cold plate and instead includes a frame that houses the heat pipes, mounting to the sides of the pipe, and allowing for direct contact of the heat pipe to the thermal source. Such designs may allow for extremely thin Z-height design specifications, even when a device housing the processor chip and cooling solution has a lid. In some cases, direct heat pipe attachment designs such as those described herein may enable thermal solutions that are approximately 0.6 mm thinner than traditional cold plate designs.

In addition, the techniques described herein may also improve conventional techniques for manufacturing virtually all mobile thermal solutions. In fact, it may also improve thermal module production for other segments of the market such as data center. The techniques described herein may cut down on the amount of manufacturing steps and/or the complexity of these steps. It may eliminate costly and time consuming reflow oven processing, for example, and may eliminate the need for extra hardware parts used in current designs (e.g., leaf springs, rivets, external cold plate, etc.). The process may manufacture a single homogenous metal (e.g., copper) part in a few rapid steps, opening the possibility for solutions that were not available with current designs, as will be described further below.

Figure 1:
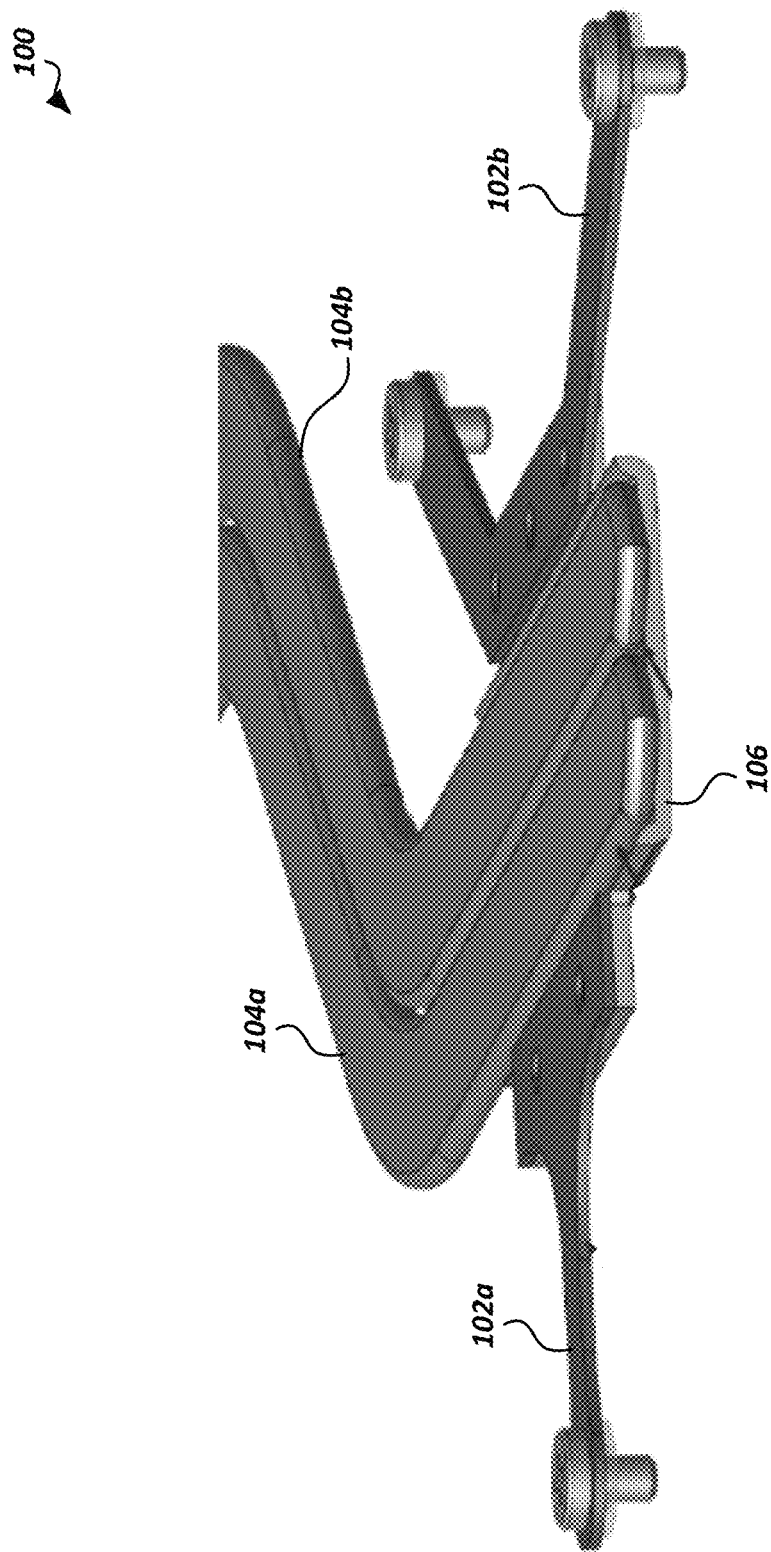
FIG. 1 is a diagram of an example processor cooling apparatus that includes heat pipes coupled to a cold plate and to attachment mechanisms.

FIG. 1 is a diagram of an example processor cooling apparatus 100 that includes heat pipes 104 coupled to a cold plate 106 and to an attachment bracket or other attachment mechanisms 102. In some cases, the attachment mechanisms 102 may be formed to function as leaf springs. The coupling between the items 102, 104, 106 may be implemented in some cases with solder (e.g., between the heat pipes 104 and cold plate 106) or with rivets (e.g., between the cold plate 106 and mechanisms 102). The apparatus 100 may suffer from failures caused by these joints. For instance, the heat pipes 104 may kink due to a lack of support from the other structures, rivets may fail between the mechanisms 102 and the cold plate 106, or the solder coupling may fail between the heat pipes 104 and the cold plate 106. In addition, the apparatus 100 may also be relatively thick due to these joints, especially for mobile applications such as laptop computers, tablets, etc. For example, the total thickness of the apparatus shown may be approximately 2.0 mm, including a thickness of approximately 0.5 mm for the mechanisms 102, a thickness of approximately 1.4 mm for the heat pipes 104, a thickness of approximately 0.1 mm for solder joining the heat pipes 104 and cold plate 106, and a thickness of approximately 0.5 mm for the cold plate 106. In contrast, aspects of the present disclosure may produce a processor cooling apparatus with a thickness that is approximately the same as that of a standard heat sink (e.g., approximately 1.4 mm or less).

The techniques described herein include using an extrusion die and all necessary extrusion hardware to allow for the manufacture of an apparatus includes flanges extending outward from the side of the heat pipe(s) for the attachment and/or loading mechanism. Following the extrusion process, the apparatus may undergo a series of other operations (e.g., cutting, stamping, etc.) which would result in one continuous metal part that includes all features for mounting the heat pipes and the attachment/loading mechanism. Traditionally, only cylindrical pipes come out of the extruder with all other features manufactured with other processes, as described above.

Not only do the techniques herein provide a robust direct heat pipe attachment assembly, they also open up many other possibilities for shapes and combination of heat pipes, frames, and attachment/loading mechanisms. In addition, direct heat pipe attachment designs such as those herein may provide the thinnest thermal modules available in the market, while still meeting the thermal requirements in the certain computer segments (e.g., laptop/notebook computers). The technology may provide an extremely robust structure because it produces one continuous part. Unless failure occurs in the material itself, no crack or break is likely to occur.

In addition, potential failures in solder-based construction can be challenging for repeatability and quality control. With such a large surface area at the connection between the cold plate and heat pipe there is a large potential for residual voids around the heat pipes which can lead to structural and thermal performance issues and high variability. Therefore, by eliminating the solder joints in processor cooling apparatuses as described here, higher quality and lower variability may be achieved. Further, with the techniques described herein, new shapes (e.g., tapered flanges and other embodiments described below) that would never be possible with traditional manufacturing methods are now feasible. Also, the technology may help to reduce the thermal resistance in the final apparatus given that it is one continuous part. Finally, the technology may reduce production cost, improving profit margins reducing product time to market.

Given there are less steps and less handling in the manufacturing process with the processes described herein, the variability of components may be much lower and overall tolerance of features on the thermal module may be much lower. Typically, a designer will have to evaluate the tolerance as Root Sum Square Tolerance of +/−3 or 4σ for all the components in the stack. Each and every part will have variability in their thickness, flatness and other characteristics. In addition, there is tolerance in the connection and interaction between parts. All of these attributes couple into a much greater tolerance in the Z (height) and even tolerance in X and Y directions. With the processes described herein, the tolerance may only depend on how accurate the extrusion die and stamping tools are. The supplier may accordingly no longer at the mercy of their supply chain for higher quality components or the assembly tolerances of each of these parts.

Overall, there are many benefits to these new techniques. For example, they may offer a faster, less expensive, more versatile solution to heat pipe based thermal solution manufacturing. They may also provide the most robust solution available to direct heat pipe attachment designs and may also provide the thinnest possible thermal solutions in the industry for this segment.

Figure 2:
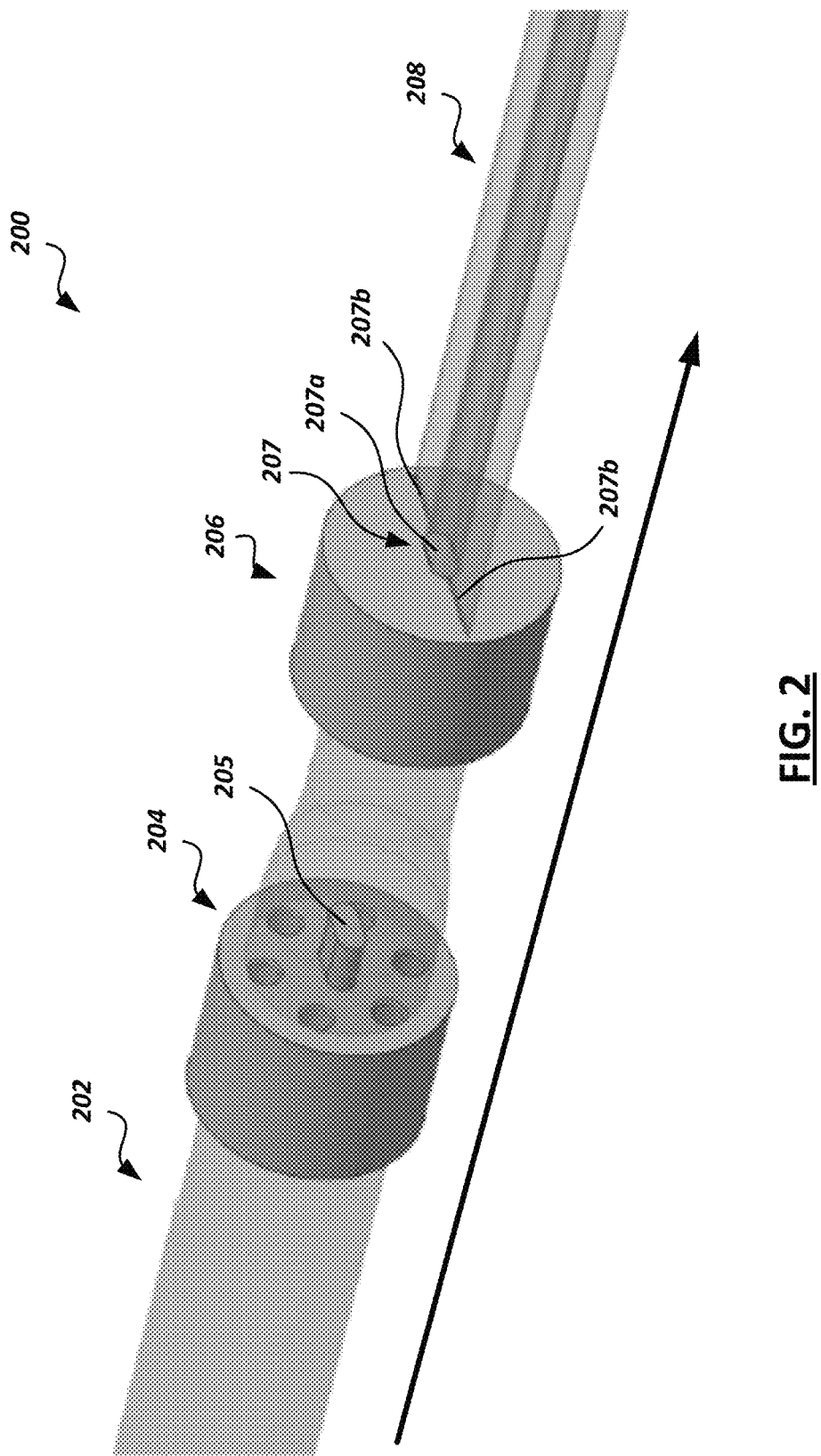
FIG. 2 is a diagram showing an example extrusion process using a feeder plate and extrusion die to form a processor cooling apparatus.

FIG. 2 is a diagram showing an example extrusion process 200 using a feeder plate 204 and extrusion die 206 to form a processor cooling apparatus. An extrusion process such as the one shown may eliminate the need for cutting and stamping a cold plate. It may also eliminate the need for reflowing solder to bond the cold plate to the heat pipe in an oven. In some cases, a variable geometry extrusion process may be used (e.g., to avoid waste). A variable geometry extrusion process may involve the movement of one or both of the feeder plate 204 and extrusion die 206 during the extrusion process.

In the example shown, a metal 202 is extruded through the feeder plate 204 and extrusion die 206, which, together, may define the profile of the resulting extruded apparatus 208. For instance, the shape or position of the portion 205 of the feeder plate 204 and the shape/position of the opening 207 of the extrusion die 206 may define the form of the extruded apparatus 208. While the extrusion process shown utilizes an extrusion die that defines an opening 207 that has a substantially stadium-shaped opening portion 207a and constant taper flange portions 207b extending radially and in opposite directions from the outer edge of the portion 207a, the profile of the opening 207 in the extrusion die 206 may be different from that shown. For example, the profile of opening portion 207a may be circular- or oval-shaped and the profile of the opening portions 207b may be tapered or may define fins as described further below. Further, the position of the portion 205 may be adjusted so that the extruded apparatus 208 has different wall thicknesses, as described further below.

Figure 3A:
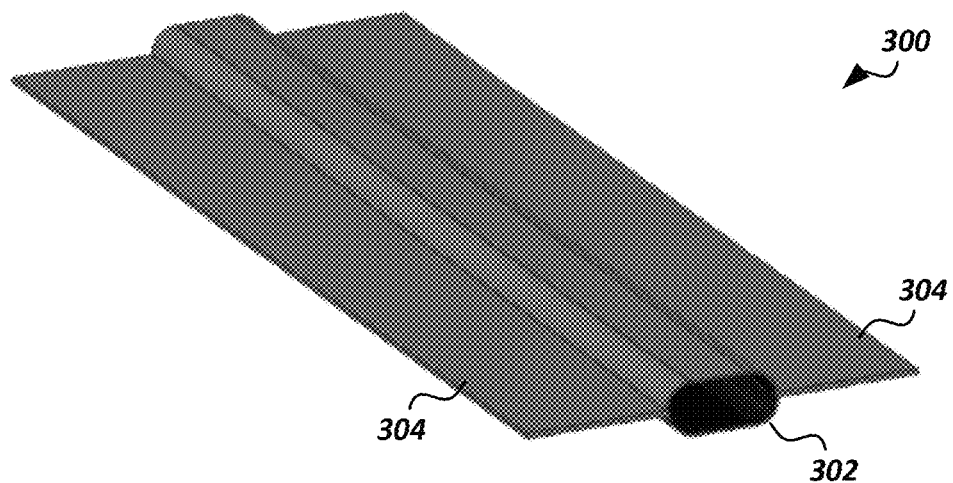
FIGS. 3A-3B are diagrams of an example apparatus that may be produced by the extrusion process shown in FIG. 2.
Figure 3B:
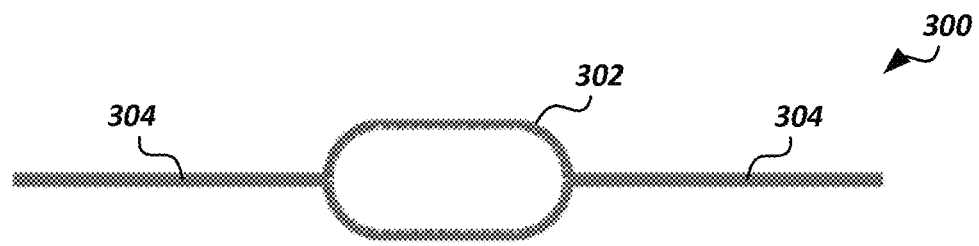

FIGS. 3A-3B are diagrams of an example apparatus 300 that may be produced by the extrusion process shown in FIG. 2. In particular, FIG. 3A shows a perspective view of the apparatus 300, while FIG. 3B shows a cross-sectional view of the apparatus 300. The example apparatus 300 includes a heat pipe portion (also referred to herein as simply "pipe" or "pipe portion") 302 and flange portions (also referred to herein as simply "flange") 304 that extend radially and in opposite directions from an exterior surface of the heat pipe portion 302. The example heat pipe portion 302 has a stadium cross-sectional geometry, though other embodiments may implement an oval cross-sectional geometry, a circular cross-sectional geometry, or another type of cross-sectional geometry. In addition, while the example heat pipe portion 302 has substantially equal wall thickness, other embodiments may implement the heat pipe portion 302 with different wall thicknesses (e.g., thicker bottom wall thickness). Further, while the example flange portions 304 have constant thickness, other embodiments may implement the flange portions 304 with a tapered thickness profile, with cooling fins, both tapered thickness profile and cooling fins, or in another manner.

The profile of the heat pipe portion 302 may reduce the amount of effort required during a subsequent flattening/compression step. This will help improve the flatness and surface finish of the pipe contact surface at the thermal interface with a processor chip. If the die is designed for only one thermal solution design, it may be possible to make the profile the final shape as long as a wick can be installed, and the pipe can be charged and sealed. This could cut down on the steps involved in manufacturing.

Figure 4B:
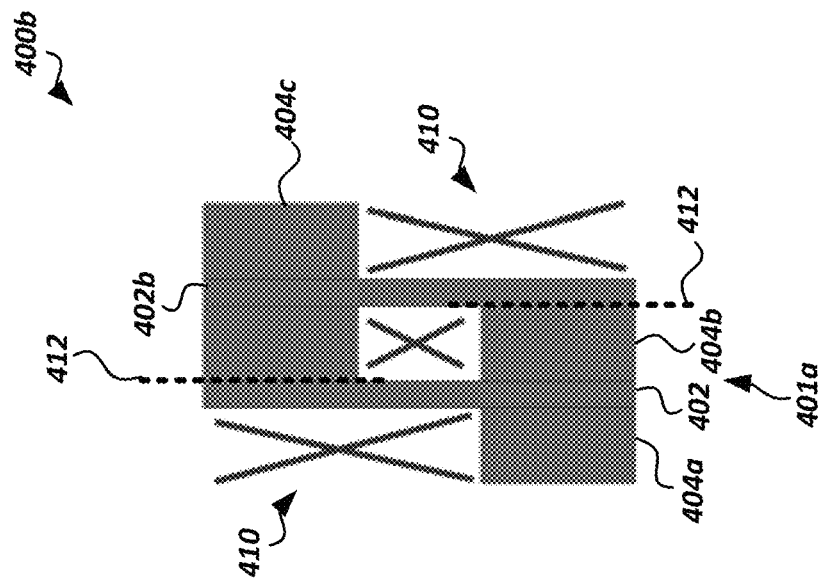
FIGS. 4A-4B are diagrams of example flange cuts that may be made to an apparatus produced by the extrusion process shown in FIG. 2.
Figure 4A:
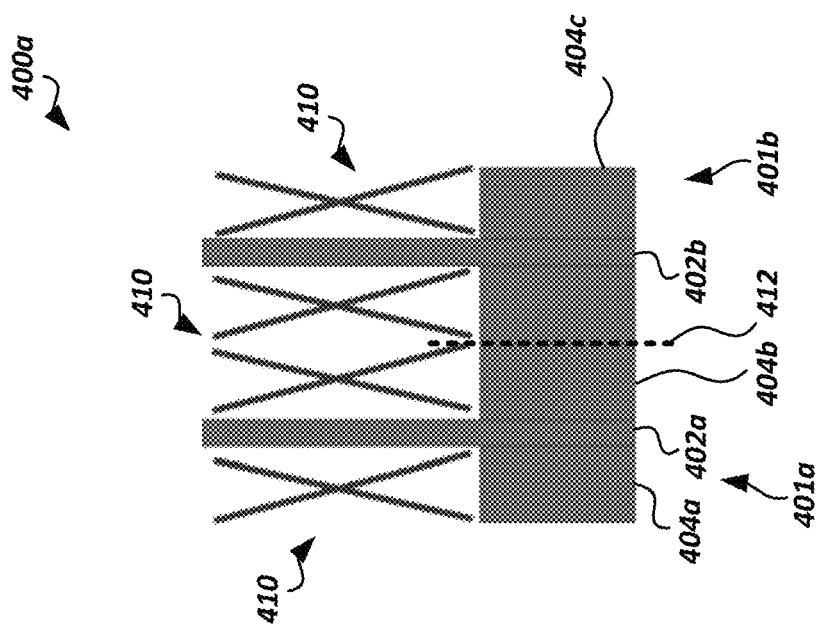

FIGS. 4A-4B are diagrams of example flange cuts that may be made to an apparatus produced by the extrusion process shown in FIG. 2. As shown, each apparatus 400 includes two heat pipe portions 402 and three flange portions 404. Each apparatus is cut in a way that removes the areas 410. Cuts are made at the lines 412 to separate the apparatus 400 into two pieces 401, each of which may be used to produce a separate processor cooling apparatus. In some cases, the flange cuts may be made using a die cut process. In some cases, the apparatus 400 may be designed such that the cuts may be made in a way that reduces wasted flange space. For instance, the cuts made in FIG. 4B may remove less overall flange space, and thus, waste. The areas 410 removed may be used to manufacture cold plates or sheet metal parts on other thermal modules or may be re-melted and re-extruded.

Figure 5:
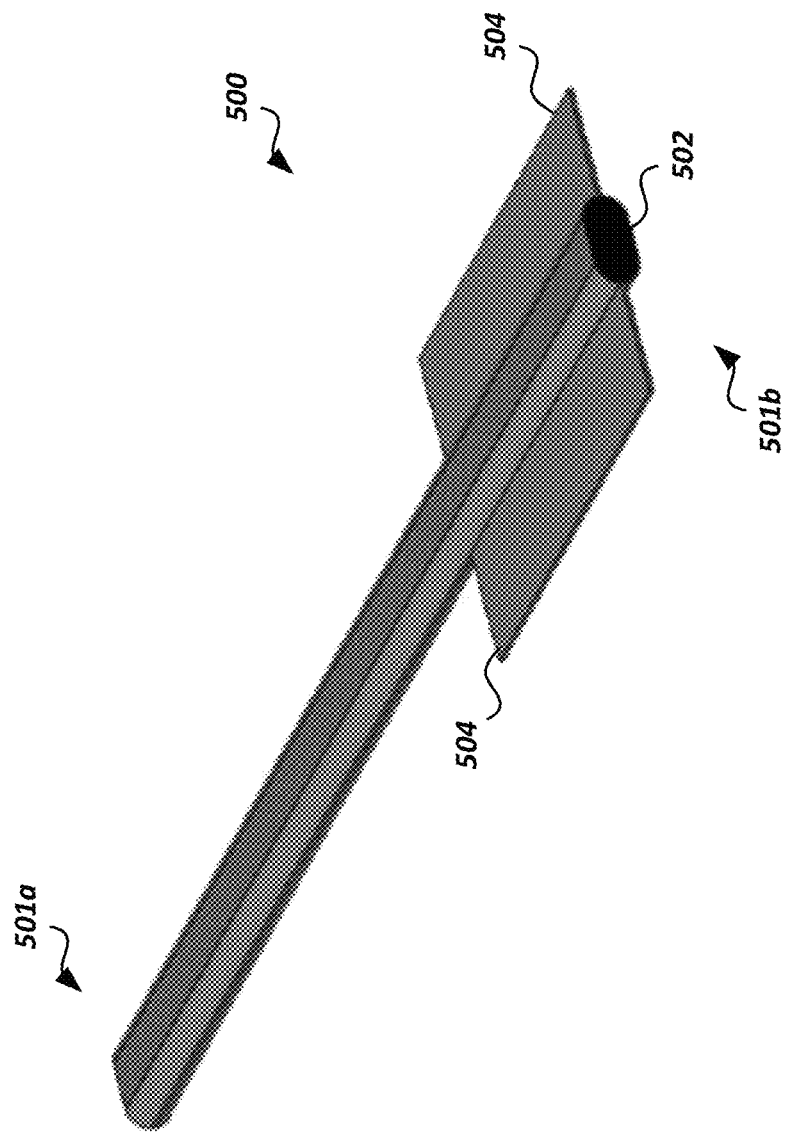
FIG. 5 is a diagram of an example apparatus produced by the flange cutting shown in FIGS. 4A-4B.

FIG. 5 is a diagram of an example apparatus 500 produced by the flange cutting shown in FIGS. 4A-4B (e.g., portions 401 described above). The apparatus 500 includes a heat pipe portion 502 and flange portions 504. The heat pipe portion 502 is open at both ends 501a, 501b in the example shown, and may be sealed as shown in FIG. 6.

Figure 6:
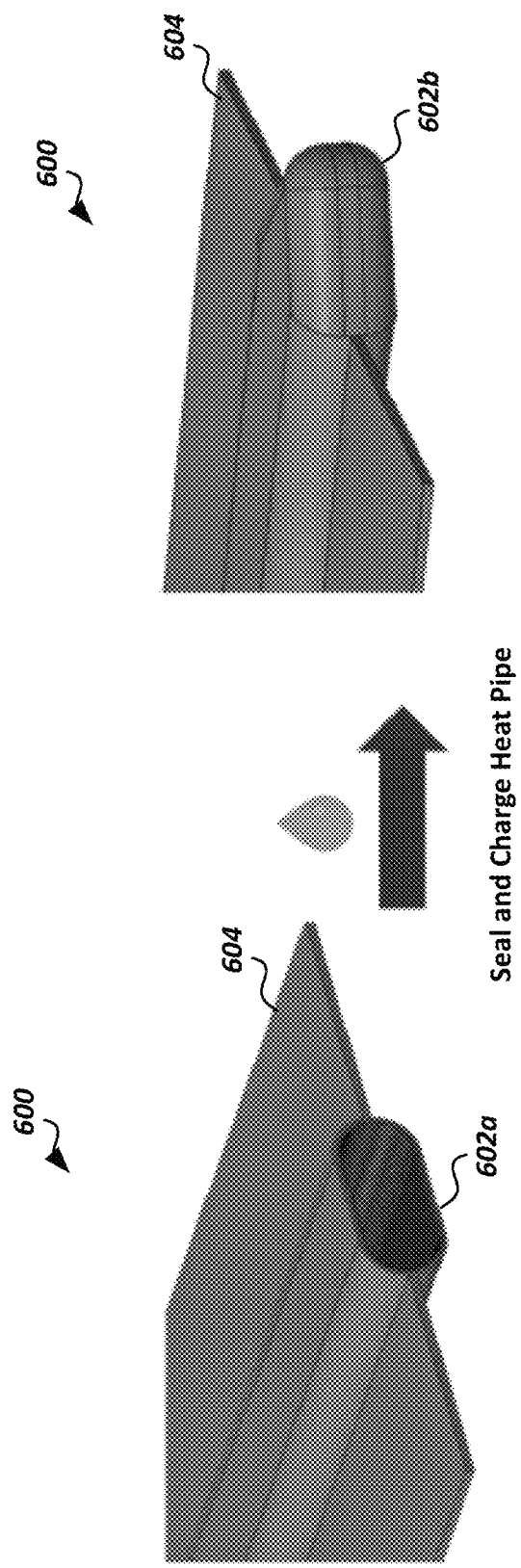
FIG. 6 is a diagram showing an example cooling apparatus before and after heat pipe sealing and charging.

FIG. 6 is a diagram showing an example cooling apparatus 600 before and after heat pipe sealing and charging. The apparatus may be similar to the apparatus 500 in some cases. The apparatus 600 includes a heat pipe portion 602 and flange portions 604. In the example shown, each end of the heat pipe portion 602 is sealed. The sealing process used may be any suitable heat pipe sealing process. FIG. 6 illustrates the sealing at one end of the heat pipe portion 602 (e.g., end 501b from FIG. 5). The same sealing process may be performed at the other end of the heat pipe portion 602 as well (e.g., end 501a from FIG. 5). Prior to sealing both ends, the heat pipe portion 602 may be charged. That is, a liquid (e.g., water) may be introduced to the interior cavity of the heat pipe portion 602. Any suitable amount of liquid may be used to charge the heat pipe.

FIG. 7 is a diagram of showing an example cooling apparatus 700 before and after heat pipe compression. The apparatus 700 may be similar to the apparatuses 500, 600 of FIGS. 5, 6. Heat pipe compression may be performed before or after the heat pipe is sealed and charged. Heat pipe compression may involve compressing the heat pipe portion 702 in a direction perpendicular or orthogonal to the radial direction in which the flange portions 704 extend from the heat pipe portion 702. Referring to FIG. 7, this means that the compression is performed in the Z direction while the flange portions 704 extend from the heat pipe portion 702 in the X, Y directions.

Heat pipe compression may also be referred to as heat pipe crushing in some cases. Given the new extrusion process can establish a semi-flattened shape (e.g., the stadium cross-sectional geometry shown in FIG. 7), the compression will not be as disruptive to the shape, integrity, surface finish and flatness of the pipe as in traditional techniques. This may have a positive impact on the thermal performance of the heat pipe by maintaining a more uniform section throughout to maintain the best flow in the pipe. In addition, the improved flatness and surface finish may provide the lowest thermal resistance while contacting the heat source. In more detail, the bond line of the thermal interface material will be thinner and more uniform which ultimately reduce the thermal resistance at this connection and allows the thermal module to cool the processor chip more effectively. This may result in better product performance for any workload.

FIGS. 8A-8B are diagrams showing example views of the cooling apparatus 500 of FIG. 5 after heat pipe sealing, charging, and compression. In particular, FIG. 8A shows a perspective view of the apparatus 800 and FIG. 8B shows a cross-sectional view of the apparatus 800. In some cases, the apparatus 800 may undergo bending steps.

FIGS. 9A-9B are diagrams showing example views of a cooling apparatus 900 after heat pipe bending. In the example shown, a bending force is applied to the heat pipe portion 902 of the apparatus 900 in a location at which flange portions were removed from the apparatus 900 (e.g., in cutting steps described above with respect to FIGS. 4A-4B). In the example shown, the heat pipe portion 902 is bent in a direction (X, Y) orthogonal to the thickness of the apparatus 900 (Z). However, the bending may be performed in any suitable direction. In some cases, a variable extrusion process may provide a way to eliminate or reduce the need for bending.

Typically, the leaf spring metal (e.g., 102 of FIG. 1) is sourced separately from the heat pipe (e.g., 104 of FIG. 1) and then undergoes cutting, stamping/forming, and riveting to attach it to a cold plate (e.g., 106 of FIG. 1). With the flange already a part of the single part apparatus produced by the extrusion process, the loading spring shape may be simply die cut and stamped into the correct shape needed. This can dramatically reduce the cost, challenge of assembly, time of production and overall integrity of the loading member attachment to the assembly. The leaf springs are often riveted to the frame. With fatigue or variability in manufacturing the rivets can fail and compromise the entire assembly.

FIGS. 10A-10B are diagrams showing example views of a cooling apparatus 1000 after flange cutting. In the example shown, the apparatus 1000 is the same as the apparatus 900 of FIGS. 9A-9B after bending is performed. As shown, the flange portion 1004 of the apparatus 1000 may be cut into a predetermined shape. The resulting shape of the flange portion 1004 may allow it to be used as an attachment/loading mechanism (similar to the mechanisms 102 of FIG.

1), which may be used to couple the apparatus 1000 to a motherboard housing the processor die to be cooled by the apparatus 1000.

FIGS. 11A-11B are diagrams showing example views of a cooling apparatus after flange stamping. In the example shown, the apparatus 1100 is the same as the apparatus 1000 of FIGS. 9A-9B after flange cutting is performed. As shown, the flange portion 1104 of the apparatus 1100 may be stamped into a predetermined shape. The resulting shape of the flange portion 1004 may allow it to be used as a leaf spring loading mechanism (similar to the mechanisms 102 of FIG. 1).

FIGS. 12A-12B are diagrams showing cross-sectional views of an example processor cooling apparatus 1200 with multiple heat pipes and tapered flanges. In the example shown, the apparatus 1200 includes a heat pipe portion 1202 that includes multiple heat pipes 1203. The heat pipes 1203 of the heat pipe portions 1202 are joined together by a connection flange 1205, which may be of the same or different thickness as the flange portions 1204. The flange portions 1204 have tapered thickness, with the tapering occurring at an angle of $\phi$ as shown, which may be any suitable angle chosen by a designer.

Plenty of literature in the structural community demonstrates the benefit of tapering beams to improve the strength at the point of attachment to the rest of an assembly while providing the appropriate amount of compliance at the unsupported end. This shape may not be possible with the traditional cold plate and leaf spring shape (e.g., as shown in FIG. 1) given it is cut and stamped out of flat metal stock rather than extruded with this shape initially. This shape, which will greatly improve thermal solution loading members, creates no additional increase in cost. There are at least two benefits: (1) less risk of yield or failure of the thermal module, and (2) less sensitivity to tolerance variation in the assembly.

With less sensitivity to tolerance, the load range may be tighter and more consistent. A tighter load range provides more consistent bond lines of the thermal interface material (which improves thermal performance) and less risk of reliability issues such as die crack/SJR issues caused by high loading or corner/edge loading. An extensive amount of carefully prescribed milling operations would possibly be required to manufacture this shape with conventional methods, which would be very costly.

Figure 13:
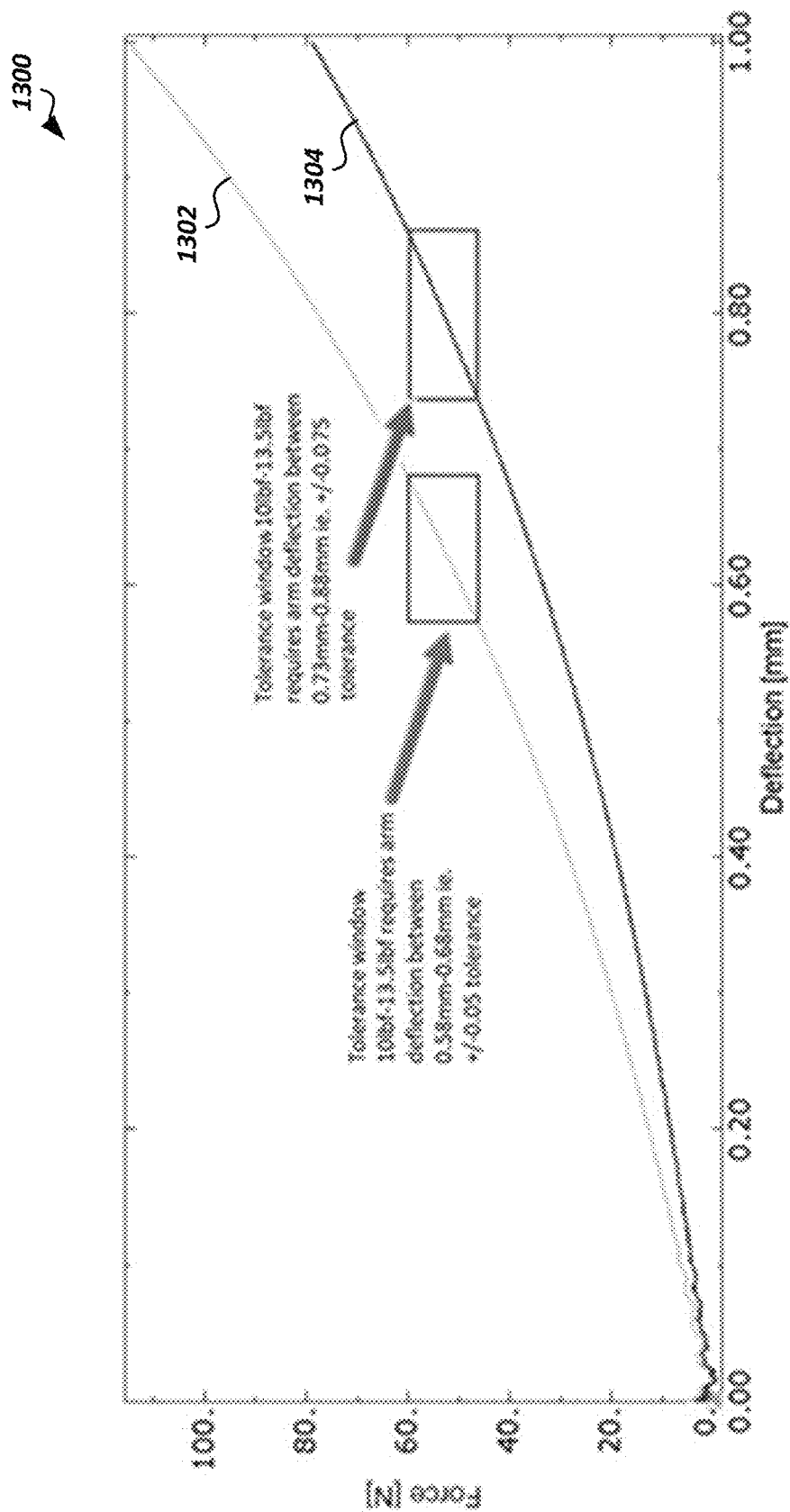
FIG. 13 is a chart showing deflection for constant thickness and tapered thickness flanges.

FIG. 13 is a chart 1300 showing deflection for constant thickness (1302) and tapered thickness (1304) flanges. It is common to have load variation in thermal models due to manufacturing tolerances which can have a negative affect on the thermal performance and/or increase the risk of reliability. FIG. 13 illustrates how the total load generated by the thermal module is less sensitive to tolerances in the assembly Z-stack. The data in chart 1300 was created using a simulation that examined how the prescribed gap between the leaf spring and the backing plate standoff could vary to generate the same load. The chart 1300 shows that with a tapered beam, even for an assembly Z-stack tolerance (directly impacting the prescribed loading gap) that is 50% greater, the load range remains the same (~10-13.5 lbf) as a thermal module with conventional rectangular leaf springs. This may result in a module that is easier to produce with less parts out of specification and less recalls on systems. This does not suggest the tolerances will be greater with the new process, rather it demonstrates how a tapered flange design may be more forgiving and reliable.

Figure 14:
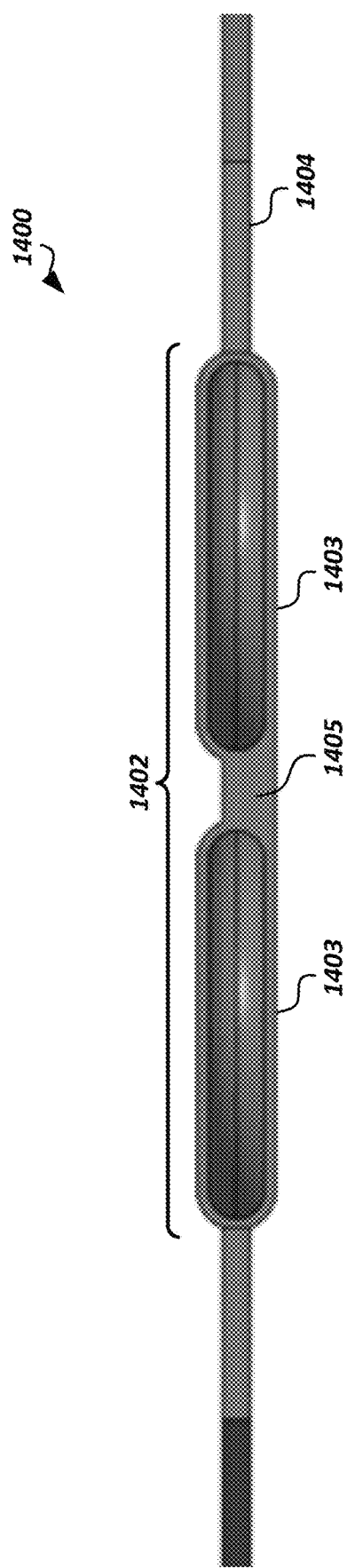
FIG. 14 is a diagram showing a cross-sectional view of an example processor cooling apparatus with a connection flange between heat pipes that is thicker than the flanges.

FIG. 14 is a diagram showing a cross-sectional view of an example processor cooling apparatus 1400 with a connection flange 1405 between heat pipes 1403 that is thicker than the flanges 1404. In the example shown, the apparatus 1400 includes a heat pipe portion 1402 that includes the multiple heat pipes 1403. The heat pipes 1403 of the heat pipe portion 1402 are joined together by a connection flange 1405. In the example shown, the thickness of the connection flange 1405 is greater than the thickness of the flange portions 1404.

Direct heat pipe attachment designs, such as apparatus 1400, may be sensitive to the flatness and surface finish of the heat pipe surface contacting the chip, die, or lid of the package (i.e., the bottom side of the apparatus 1400 as shown in FIG. 14). As a mitigation to this issue a thicker flat bottom shape could be implemented as shown in FIG. 14. This could also provide a stiffer assembly to improve the bond line and integrity of the total assembly. In addition, the extra material would provide more thermal mass with next to no impact on the Z-height (i.e., the vertical direction in FIG. 14) and space constraints available. With the thermal mass increase thermal spreading and overall thermal performance may improve.

Figure 15:
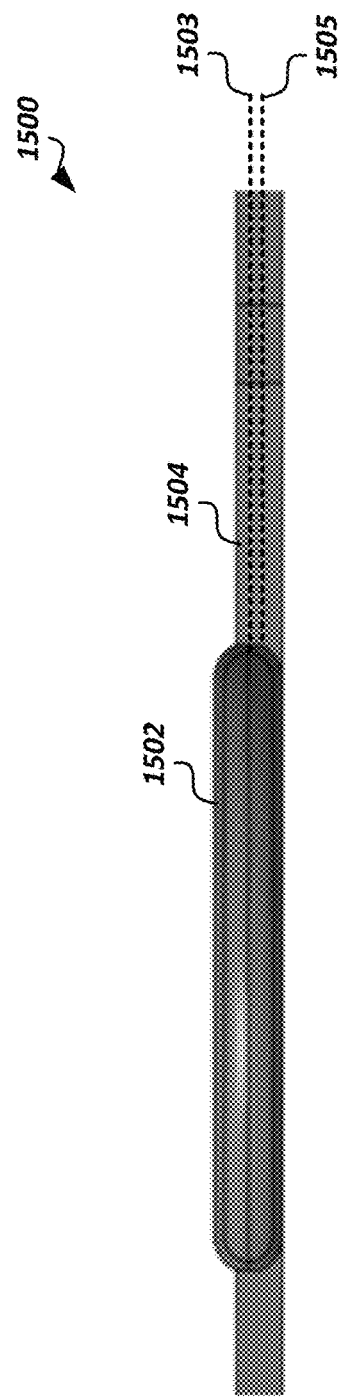
FIG. 15 is a diagram showing a cross-sectional view of an example processor cooling apparatus with flanges having a cross-sectional centerline offset from the cross-sectional centerline of the heat pipe.

Another knob to turn is the flange thickness to increase the thermal mass or increase stiffness wherever needed. FIG. 15 provides an example of what is possible with this technology. In particular, FIG. 15 is a diagram showing a cross-sectional view of an example processor cooling apparatus 1500 with flanges 1504 having a cross-sectional centerline 1505 offset from the cross-sectional centerline 1503 of the heat pipe 1502.

In some embodiments, aspects of the thicker connection flange embodiment shown in FIG. 14 may be combined with aspects of the offset centerline embodiment shown in FIG. 15.

Figure 16A:
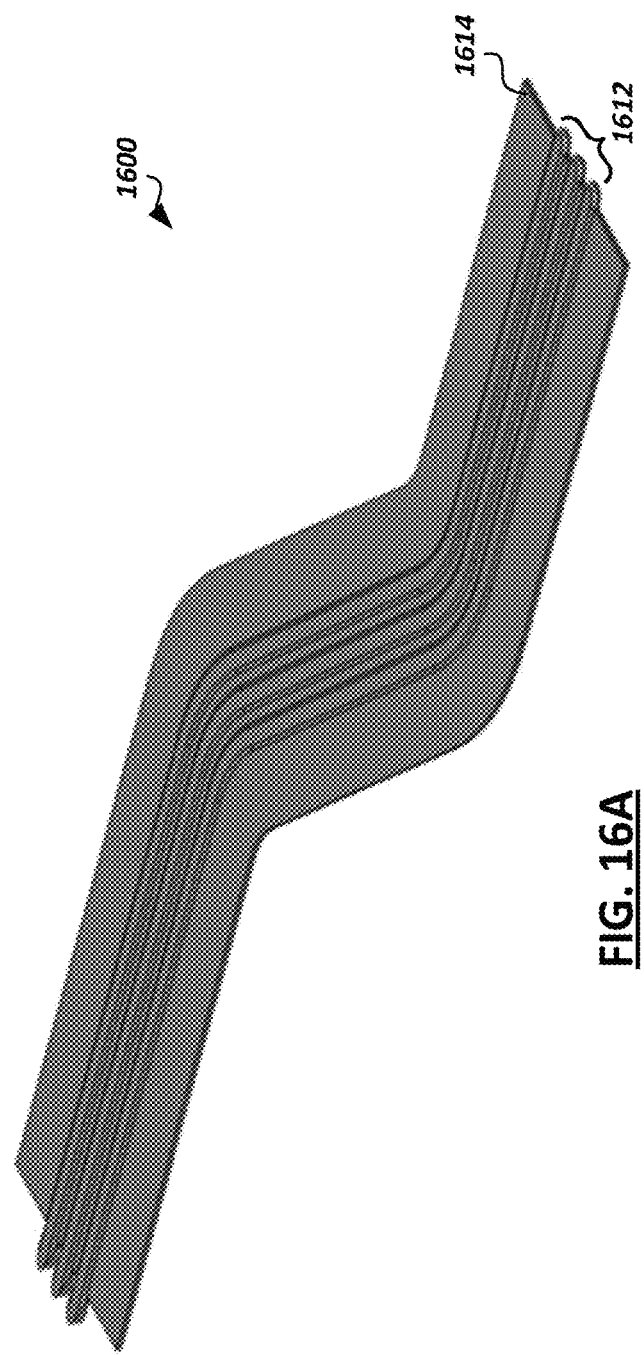
FIGS. 16A-16B are diagrams showing views of an example processor cooling apparatus with multiple heat pipes.
Figure 16B:
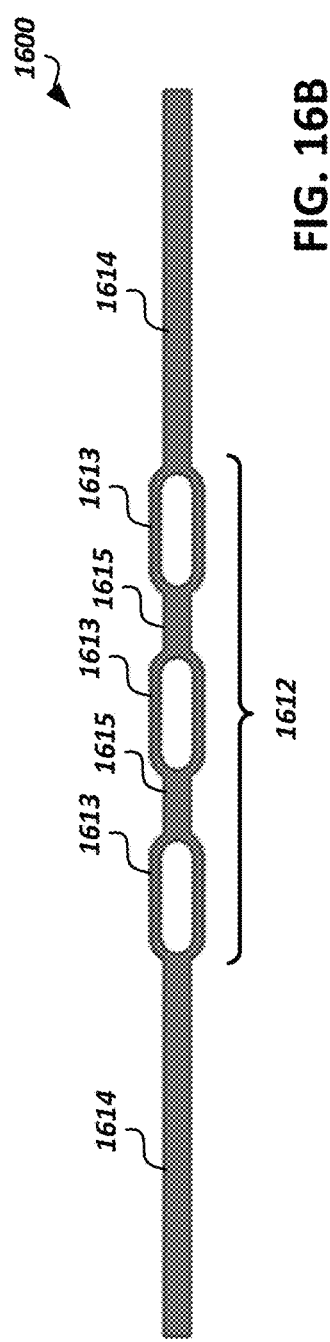

FIGS. 16A-16B are diagrams showing views of an example processor cooling apparatus 1600 with multiple heat pipes. In particular, FIG. 16A shows a perspective view of the apparatus 1600 and FIG. 16B shows a cross-sectional view of the apparatus 1600. In the example shown, the apparatus 1600 includes a heat pipe portion 1612 that includes three heat pipes 1613. The heat pipes 1613 are joined together with connection flanges 1615, which may be of the same or different thickness than the flange portions 1614.

One of the major thermal challenges heat pipe thermal solutions face is placement of the center of the heat pipe over the hot spot of the package (e.g., processor). Unfortunately, with a thermal module that has multiple heat pipes, a hot spot is likely to land in the middle of the package and in between the heat pipes. This means the thermal performance may not be optimized. One benefit of the techniques described herein is that heat pipes could offer single pipe designs with no connection gap between pipes, which may be more optimal for thermal performance across the package. This may eliminate layout challenges for package designers, thermal solution vendors, and the thermal mechanical designers that have to bridge the gap between parties.

In some circumstances the hot spot is not at risk of being between pipes. In this instance, multiple pipes may be ideal to allow for routing to multiple locations in the product. For example, a thermal module may need to cool a CPU package, GPU package and memory components. This may not be an issue with the techniques described herein, as multiple pipe sizes can be extruded for unique designs (e.g., as shown in FIG. 16A-16B). In fact, it may be of interest for the tooling engineers to develop modular blocks in a die that can be swapped to customize the build or have alternative die available to suit the needs of each customer. If the pipes had to be routed to multiple locations, the bending of the heat pipes could be customized to suit the needs of the product. For instance, after the flange portions 1614 are cut, each heat pipe 1613 may be bent in a different manner to allow for routing to a different location.

Figure 17A:
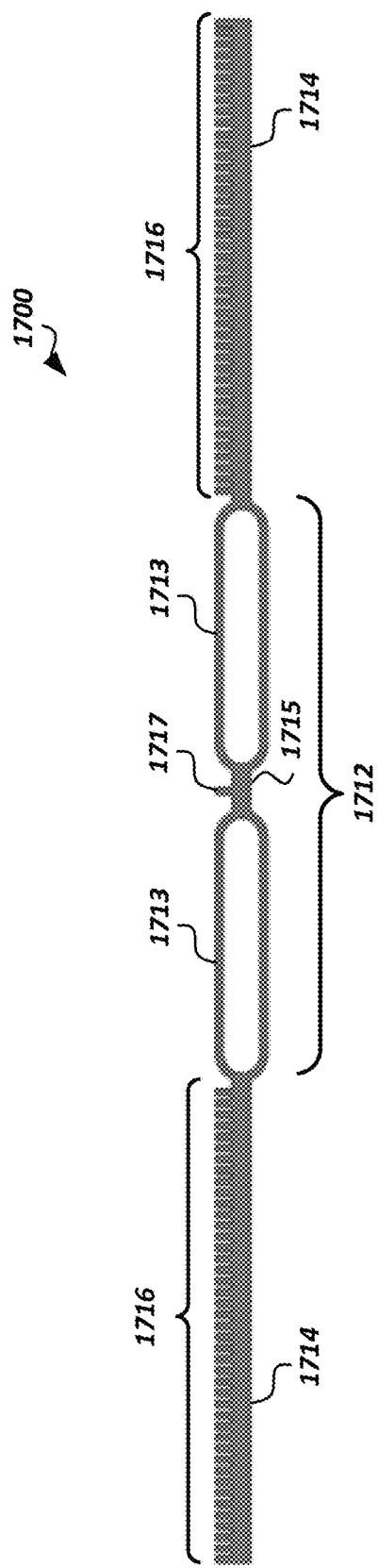
FIGS. 17A-17B are diagrams showing views of an example processor cooling apparatus with multiple heat pipes and flanges having fins extending therefrom.
Figure 17B:
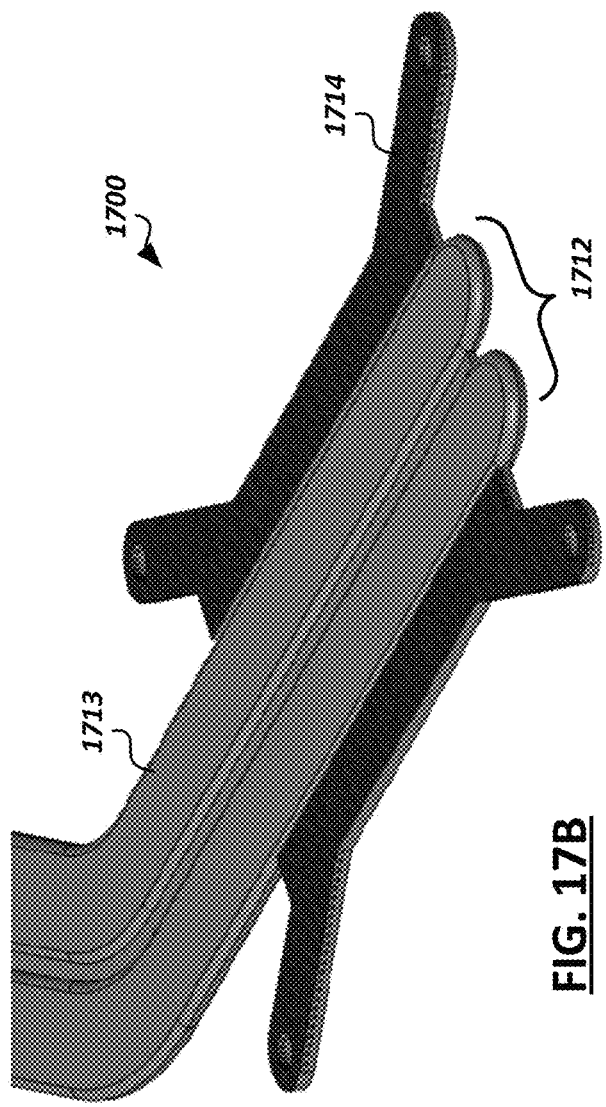

FIGS. 17A-17B are diagrams showing views of an example processor cooling apparatus 1700 with multiple heat pipes 1713 and flanges 1714 having fins 1716 extending therefrom. In particular, FIG. 17A shows a cross-sectional view of the apparatus 1700 and FIG. 17B shows a perspective view of the apparatus 1700. In the example shown, the apparatus 1700 includes a heat pipe portion 1712 that includes two heat pipes 1713. The heat pipes 1713 are joined together with a connection flange 1715, which may be of the same or different thickness than the flange portions 1714. In addition, the flange portions 1714 comprise a set of cooling fins 1716 that extend outward from an exterior surface of the flange portions 1714. Further, the connection flange 1715 comprises a cooling fin 1717 that extends outward from its exterior surface. Although the fins 1716, 1717 are shown as having a substantially rectangular shape extending orthogonally from the flanges 1714, 1715, respectively, the shape of the fins may be different from those shown.

If variable extruding offers a method to pivot the extrusion 90°, even the heat exchanger can be produced. Regardless, the idea of unique fin shape and placement could open a whole realm of new possibilities in thermal solution design. One concept may be to place micro-fins wherever desired. For example, with the demand for increasingly higher PL2s for additional performance, the voltage regulators (VR) in the board are starting to use passively cooled solution to avoid throttling of the CPU. Systems in the market, especially high-end gaming, are starting to use thermal solutions for their VRs to be able to handle the increasingly higher powers. With the idea proposed here, the flange can be easily extended towards these VRs to cool them. Additionally, the techniques described herein may easily allow the addition of fins, which will increase the surface area and help obtain reduced temperatures in the VRs. This would once again create a much more rapid process for manufacturing as compared to mounting a separate heat exchanger part. Even greater exploration may be able to utilize machining learning algorithms to develop unique topologies or fin profiles to optimize thermal performance.

The following provides a more detailed look at the thermal benefits that may be achieved by aspects of the present disclosure. Because heat pipe thermal solutions produced by the techniques herein will be one continuous part attached to all other features in the thermal module, there may be no additional thermal resistance that would normal be present between multiple soldered, riveted, crimped or otherwise attached components. The following thermal analysis below demonstrates how much improvement may be feasible. Most notably, the thermal resistance between a cold plate and heat pipe may no longer exist with embodiments of the present disclosure.

Figure 18A:
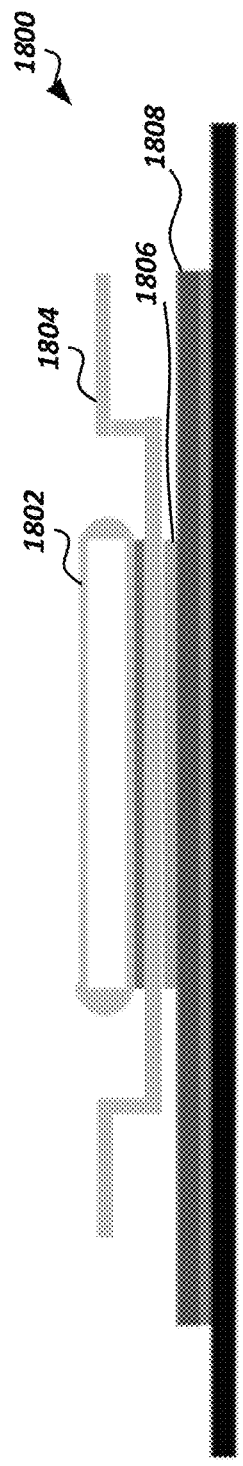
FIGS. 18A-18C are diagrams showing views of different processor cooling apparatus embodiments.
Figure 18B:
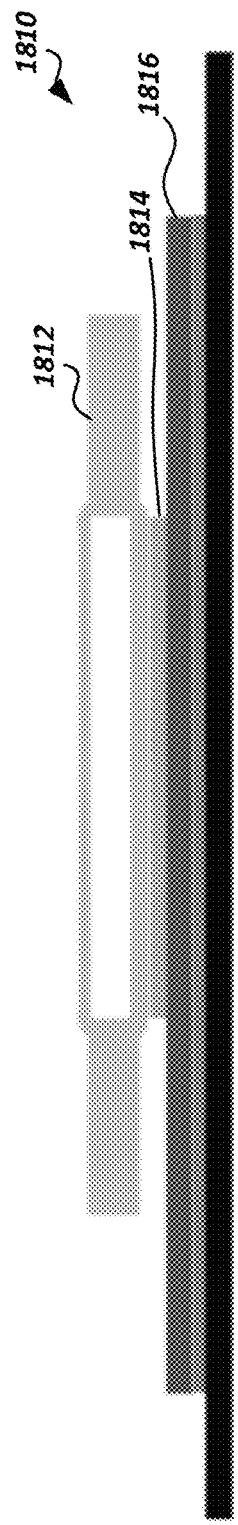
Figure 18C:
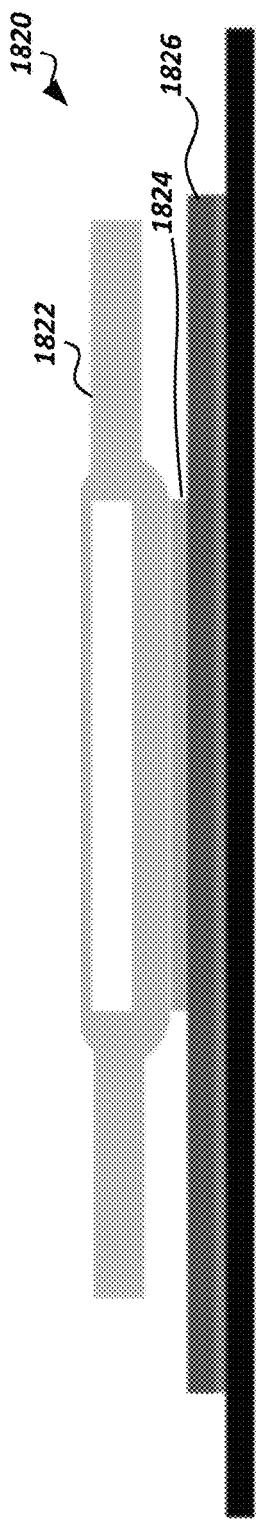

FIGS. 18A-18C are diagrams showing views of different processor cooling apparatus embodiments. In FIG. 18A, the system 1800 includes a heat pipe 1802 coupled to a cold plate 1804 via solder. The coupled heat pipe 1802 and cold plate 1804 are then positioned relative to a processor die 1806 on a motherboard 1808 such that the heat pipes 1802 may absorb heat emitted from the processor die 1806. This embodiment is similar to that shown in FIG. 1. In FIG. 18B, the system 1810 includes a cooling apparatus 1812 that is extrusion formed with a heat pipe portion and flange portion as described above. The apparatus 1812 has the same top and bottom wall thickness in the heat pipe portion (e.g., similar to apparatus 300 of FIGS. 3A-3B). The apparatus 1812 is positioned relative to a processor die 1814 to absorb heat from the processor die 1814, and the processor die is on a motherboard 1816. In FIG. 18C, the system 1820 includes a cooling apparatus 1822 that is extrusion formed with a heat pipe portion and flange portion as described above. The apparatus 1822 has a greater bottom wall (i.e., the wall of the heat pipe portion that is positioned immediately next to the processor to absorb heat emitted therefrom) thickness than top wall (i.e., the wall of the heat pipe portion that is opposite the bottom wall) thickness in the heat pipe portion. The apparatus 1822 is positioned next to a processor die 1824 to absorb heat from the processor die 1824, and the processor die is on a motherboard 1826. Example measurements for each embodiment are shown in Table 1 below. These measurements may refer to the respective thicknesses of each layer shown in FIGS. 18A-18C in the Z direction (i.e., the vertical direction in FIGS. 18A-18C).

TABLE 1

Example measurements for cooling apparatus embodiments shown in FIGS. 18A-18C

|  | 1 Heat pipe + 0.5 mm cold plate (FIG. 18A) [mm] | 1 Heat Pipe using the extrusion process (FIG. 18B) [mm] | 1 Heat Pipe using the extrusion process with 0.2 mm thicker bottom wall (FIG. 18C) [mm] |
| --- | --- | --- | --- |
| Motherboard | 0.80 | 0.80 | 0.80 |
| TGL U package | 1.20 | 1.20 | 1.20 |
| TIM | 0.05 | 0.05 | 0.05 |
| Cold plate | 0.50 | 0.00 | 0.00 |
| Solder layer | 0.10 | 0.00 | 0.00 |
| Heat Pipe | 1.40 | 1.40 | 1.60 (+0.2 mm in bottom wall) |
| Total z-ht | 4.05 | 3.45 | 3.65 |
| Total z-ht reduction |  | 0.60 | 0.40 |

Figure 19:
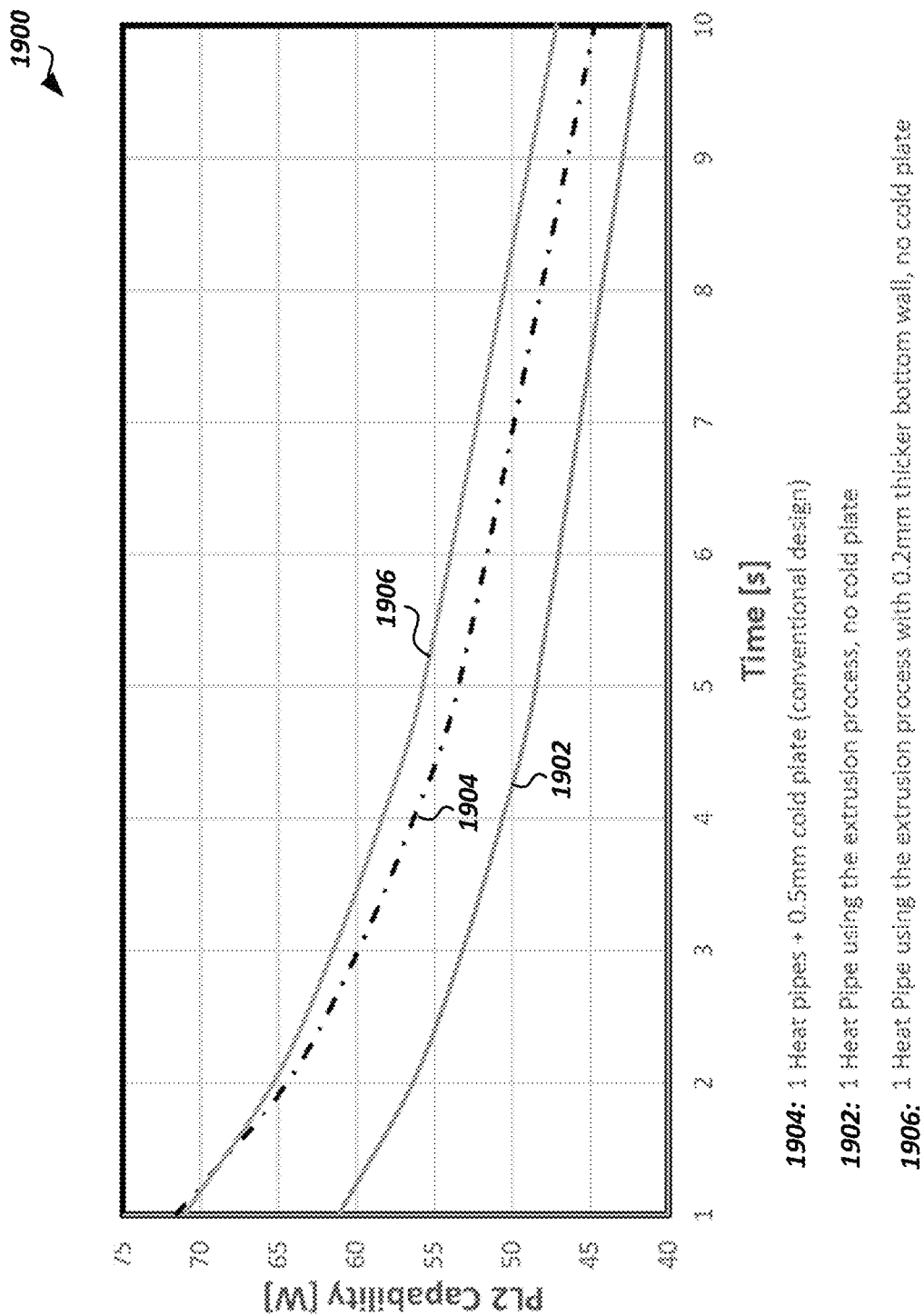
FIG. 19 is a chart showing cooling performance for the respective embodiments shown in FIGS. 18A-18C.

FIG. 19 is a chart 1900 showing cooling performance for the respective embodiments shown in FIGS. 18A-18C. In particular, the line 1902 refers to the embodiment shown in FIG. 18B, the line 1904 refers to the embodiment shown in FIG. 18A, and the line 1906 refers to the embodiment shown in FIG. 18C.

As shown in FIG. 19, an embodiment such as that shown in FIG. 18B can reduce the PL2 capability (power level 2, which may refer to a short-term maximum power draw) of the thermal solution when compared with a separate cold plate—heat pipe design as shown in FIG. 18A. In addition, by increasing the thickness of the bottom wall of the heat pipe as in the embodiment shown in FIG. 18C, the PL2 capability can be further improved.

The designer can decide if the overall thickness of the heat pipe is left the same or if it is increased to accommodate the thicker bottom. If the thickness of the heat pipe is left the same, the vapor space will be reduced, which can affect the heat pipe heat carrying capacity. If the thickness is increased, the additional copper mass and spreading can benefit the overall performance. As it can be observed in the chart 1900, by increasing the bottom thickness of the heat pipe by 0.2 mm, the PL2 capability of the conventional design was exceeded, while still saving 0.4 mm of thickness. Additionally, with the design proposed here, the solder layer in the assembly is removed, which would provide ~1 W of additional PL2 capability. If the solder layer in the conventional design has voids and imperfections, the improvement in PL2 may be higher when this defective layer is removed.

Figure 20A:
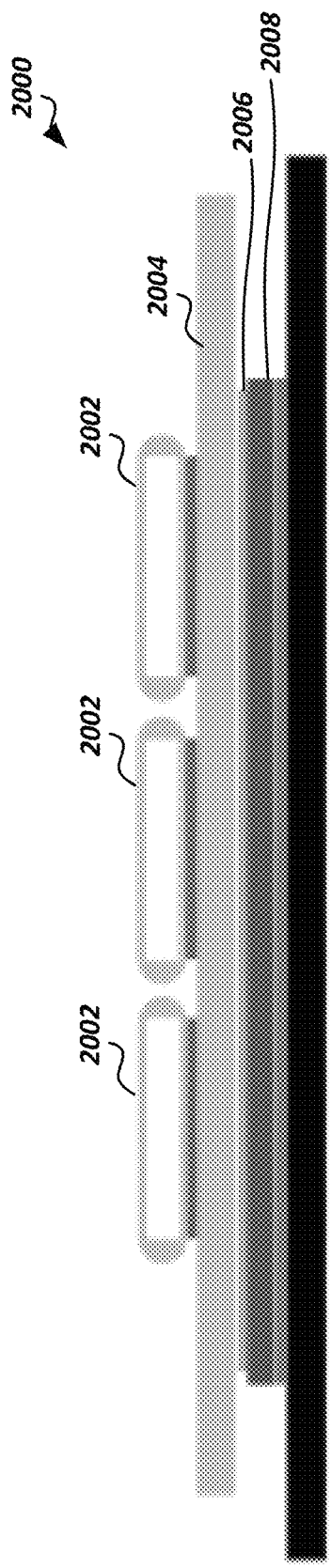
Figure 20B:
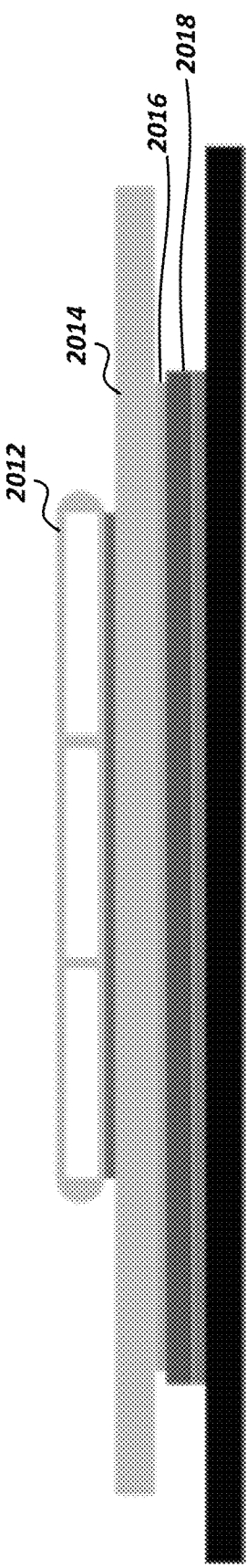

FIGS. 20A-20D are diagrams showing views of different processor cooling apparatus embodiments with multiple heat pipes. In FIG. 20A, the system 2000 includes multiple heat pipes 2002 coupled to a cold plate 2004 via solder. The cold plate 2004 is positioned next to a processor die 2006 on a motherboard 2008 such that the cold plate and heat pipes may absorb heat from the processor. Each heat pipe 2002 is not directly coupled to the other heat pipes 2002. In FIG. 20B, the system 2010 includes multiple heat pipes 2012 coupled to a cold plate 2014 via solder. As before, the cold plate 2014 is positioned next to a processor die 2016 on a motherboard 2018 so the cold plate and heat pipes may absorb heat emitted from the processor die. Each heat pipe 2012 is directly coupled to other heat pipes 2002 as shown. In FIG. 20C, the system 2020 includes a cooling apparatus 2022 that is extrusion formed with a heat pipe portion and flange portion as described above. The heat pipe portion here includes three heat pipes, and the apparatus 2012 has the same top and bottom wall thickness in the heat pipe portion. The apparatus 2022 is positioned next to a processor die 2026 for cooling, and the processor die is on a motherboard 2028. In FIG. 20D, the system 2030 includes a cooling apparatus 2032 that is extrusion formed with a heat pipe portion and flange portion as described above. The heat pipe portion here includes three heat pipes as in FIG. 20C. However, the apparatus 2032 has a greater bottom wall (i.e., the wall of the heat pipe portion that is positioned immediately next to the processor) thickness than top wall (i.e., the wall of the heat pipe portion that is opposite the bottom wall) thickness in the heat pipe portion. The apparatus 2032 is positioned next to a processor die 2036 for cooling, and the processor die is on a motherboard 2038. Example measurements for each embodiment are shown in Table 2 below. These measurements may refer to the respective thicknesses of each layer shown in FIGS. 20A-20D in the Z direction (i.e., the vertical direction in FIGS. 20A-20D).

TABLE 2

Example measurements for cooling apparatus embodiments shown in FIGS. 20A-20D

|  | 3 Heat pipes + 1.0 mm cold plate (FIGS. 20A and 20B) [mm] | 3 Heat Pipes with no gap in between using the extrusion process (FIG. 20C) [mm] | 3 Heat Pipes with no gap in between using the extrusion process with 0.2 mm thicker bottom wall (FIG. 20D) [mm] |
|---|---|---|---|
| Motherboard | 1.00 | 1.00 | 1.00 |
| TGL U package | 1.40 | 1.40 | 1.40 |
| TIM | 0.05 | 0.05 | 0.05 |
| Cold plate | 1.00 | 0.00 | 0.00 |
| Solder layer | 0.10 | 0.00 | 0.00 |
| Heat Pipe | 1.40 | 1.40 | 1.60 (+0.2 mm in bottom wall) |
| Total z-ht | 4.95 | 3.85 | 4.05 |
| Total z-ht reduction |  | 1.10 | 0.90 |

Figure 21:
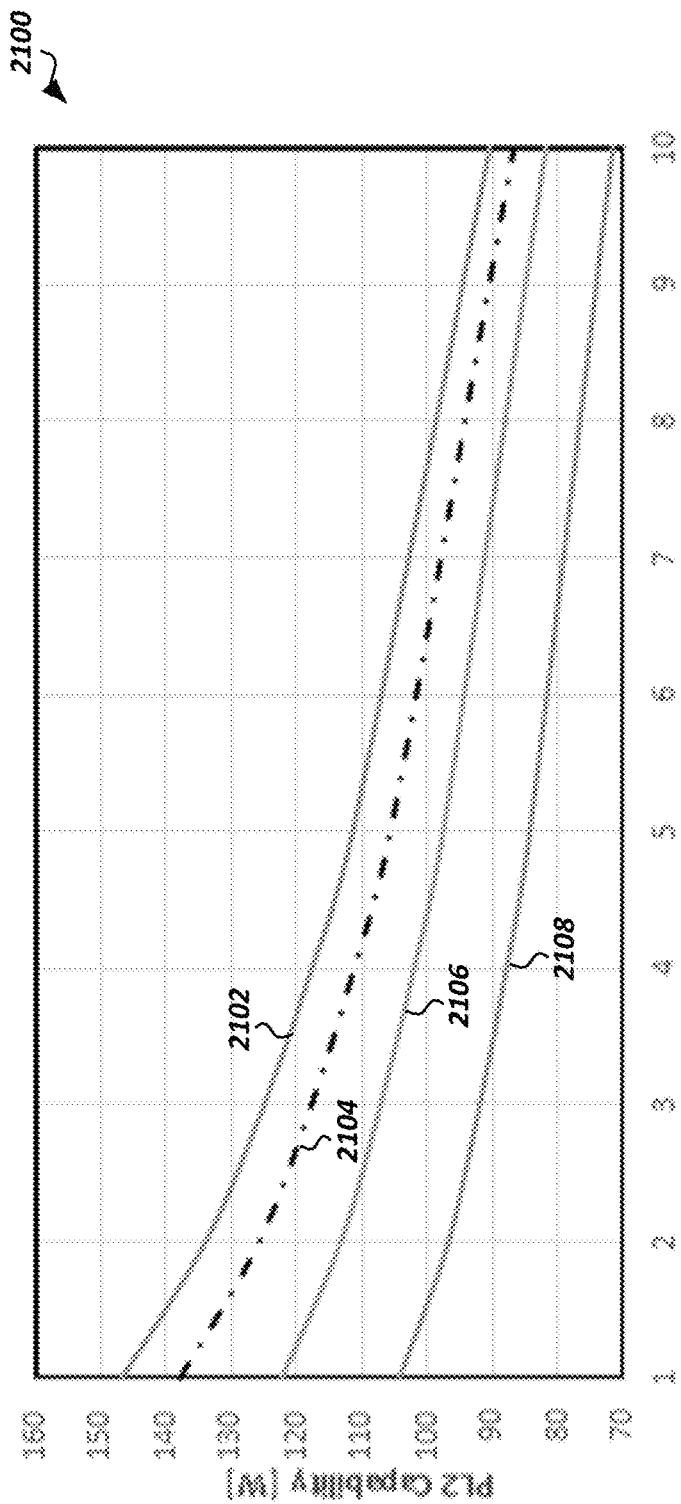
FIG. 21 is a chart showing cooling performance for the respective embodiments shown in FIGS. 20A-20D.

FIG. 21 is a chart showing cooling performance for the respective embodiments shown in FIGS. 20A-20D. In particular, the line 2102 refers to the embodiment shown in FIG. 20B, the line 2104 refers to the embodiment shown in FIG. 20A, the line 2106 refers to the embodiment shown in FIG. 20D, and the line 2108 refers to the embodiment shown in FIG. 20C.

As shown in FIG. 21, due to the gaps between the heat pipe in the embodiment shown in FIG. 20A, the hot spots were not covered. To show the impact of this gap, a second scenario for the embodiment shown in FIG. 20B was ran, in which the gap between the heat pipes was removed so that all the cores were covered by the heat pipe. As a result, the PL2 capability at 5 s increased by 5 W. With extrusion process embodiments, wider heat pipes than what the market currently offers could be designed to get a single heat pipe capable of supporting the required Qmax while covering the entire package. Although these two embodiments shown in FIGS. 20C-20D show the PL2 capability of the thicker bottom wall design of FIG. 20D could not be reached, there is still a significant reduction in the height with only 5-9% reduction in the power capability. If desired, the designer could choose to have a lower reduction in height to achieve higher PL2 capabilities.

Figure 22:
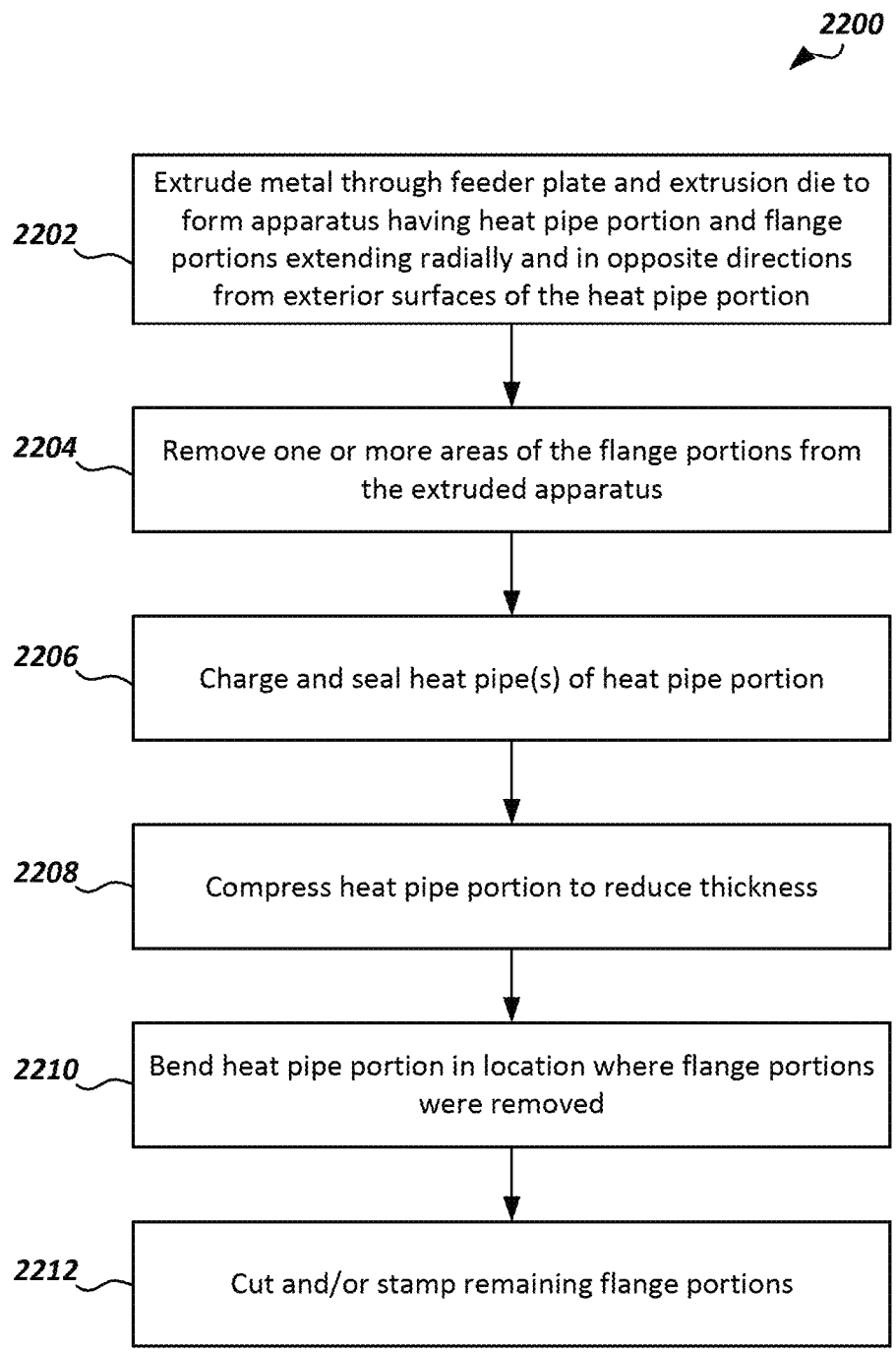
FIG. 22 is a flow diagram showing an example process for producing a processor cooling apparatus.

FIG. 22 is a flow diagram showing an example process for producing a processor cooling apparatus. The example processes may include additional or different operations, and the operations may be performed in the order shown or in another order. In some cases, one or more of the operations shown in FIG. 22 are implemented as processes that include multiple operations, sub-processes, or other types of routines. In some cases, operations can be combined, performed in another order, performed in parallel, iterated, or otherwise repeated or performed another manner.

At 2202, a metal is extruded through a feeder plate and extrusion die to form an apparatus having a heat pipe portion and flange portions extending radially and in opposite directions from exterior surfaces of the heat pipe portion. This may be done using feeder plates and extrusion dies similar to those shown in FIG. 2. The resulting apparatus may appear similar to the apparatus 300 of FIGS. 3A-3B. The feeder plate and extrusion die may define features (e.g., protrusions and/or openings) that produce an extruded heat pipe portion has one of a stadium cross-sectional geometry, an oval cross-sectional geometry, or a circular cross-sectional geometry. In addition, the feeder plate and extrusion die may define features (e.g., protrusions and/or openings) that produce extruded flange portions having constant cross-sectional thickness (e.g., as shown in and described above with respect to FIGS. 3A-3B) or tapered cross-sectional thicknesses (e.g., as shown in and described above with respect to FIG. 12), or having a set of fins that extend outward from an exterior surface of the flange portions (e.g., as shown in and described above with respect to FIG. 17). In some embodiments, the feeder plate and extrusion die may define features (e.g., protrusions and/or openings) that produce extruded apparatus with a bottom wall thickness of the heat pipe portion being greater than a top wall thickness of the heat pipe portion (e.g., as shown in and described above with respect to FIG. 14). In some embodiments, the feeder plate and extrusion die may define features (e.g., protrusions and/or openings) that produce extruded apparatus with a cross-sectional centerline of the heat pipe portion being offset from a cross-sectional centerline of the flange portions (e.g., as shown in and described above with respect to FIG. 15). In some embodiments, the feeder plate and extrusion die may define features (e.g., protrusions and/or openings) that produce an extruded apparatus with multiple heat pipes in the heat pipe portion and connection flanges between the heat pipes (e.g., as shown in and described above with respect to FIGS. 16A-16B). The cross-sectional thickness of the connection flanges may be greater than or the same as the thickness of the flange portions. In some cases, a variable geometry extrusion process may be used at 2202.

At 2204, one or more areas of the flange portions are removed from the extruded apparatus. This may be done in a manner similar to that described above with respect to FIGS. 4A-4B, with the apparatus appearing similar to the apparatus 500 shown in FIG. 5 after the flange portions have been removed.

At 2206, heat pipe(s) of heat pipe portion are charged and sealed. This may be done in a manner similar to that described above with respect to FIG. 6.

At 2208, the heat pipe portion is compressed to reduce thickness. The compression may occur in a direction orthogonal to the direction in which the flange portions extend from the heat pipe portion. For instance, the compression may occur in a manner similar to that described above with respect to FIG. 7. The apparatus may appear as shown in FIGS. 8A-8B as a result.

At 2210, the heat pipe portion is bent. This may occur in location of the apparatus where flange portions were removed from the heat pipe portion. The bending may occur in a manner similar to that described above with respect to FIGS. 9A-9B, and the apparatus may appear as shown in those figures as a result.

At 2212, the remaining flange portions are cut and/or stamped. The flanges may be cut and/or stamped so that they may be utilized as attachment and/or loading mechanisms for attaching the apparatus to a motherboard that houses the processor to be cooled by the apparatus. The cutting and stamping may occur in a manner similar to that described above with respect to FIGS. 10A-10B and 11A-11B. In some cases, the cutting and stamping may form leaf spring mechanisms using the flange portions.

Figure 23:
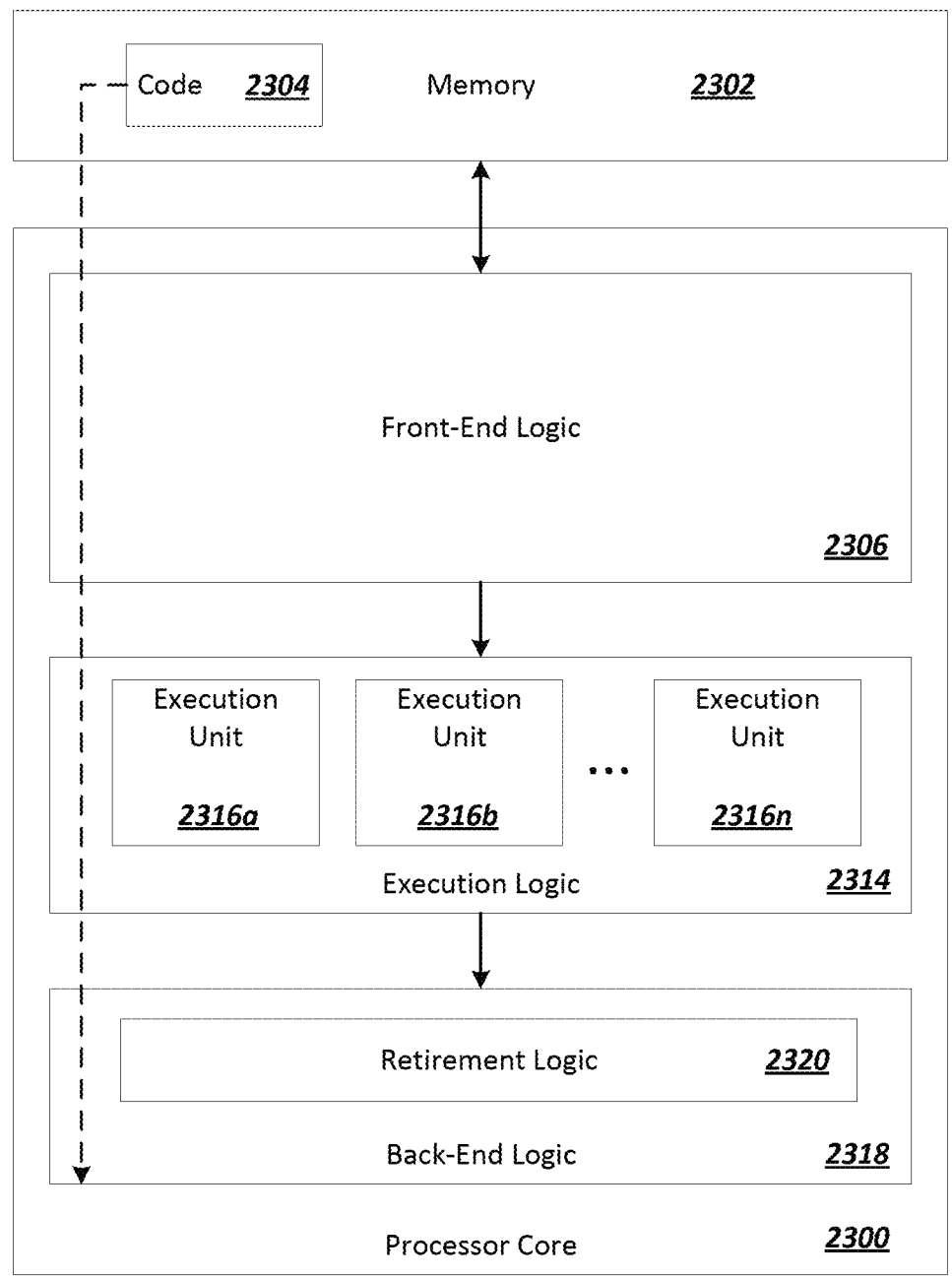
FIG. 23 is an example illustration of a processor according to an embodiment.
Figure 24:
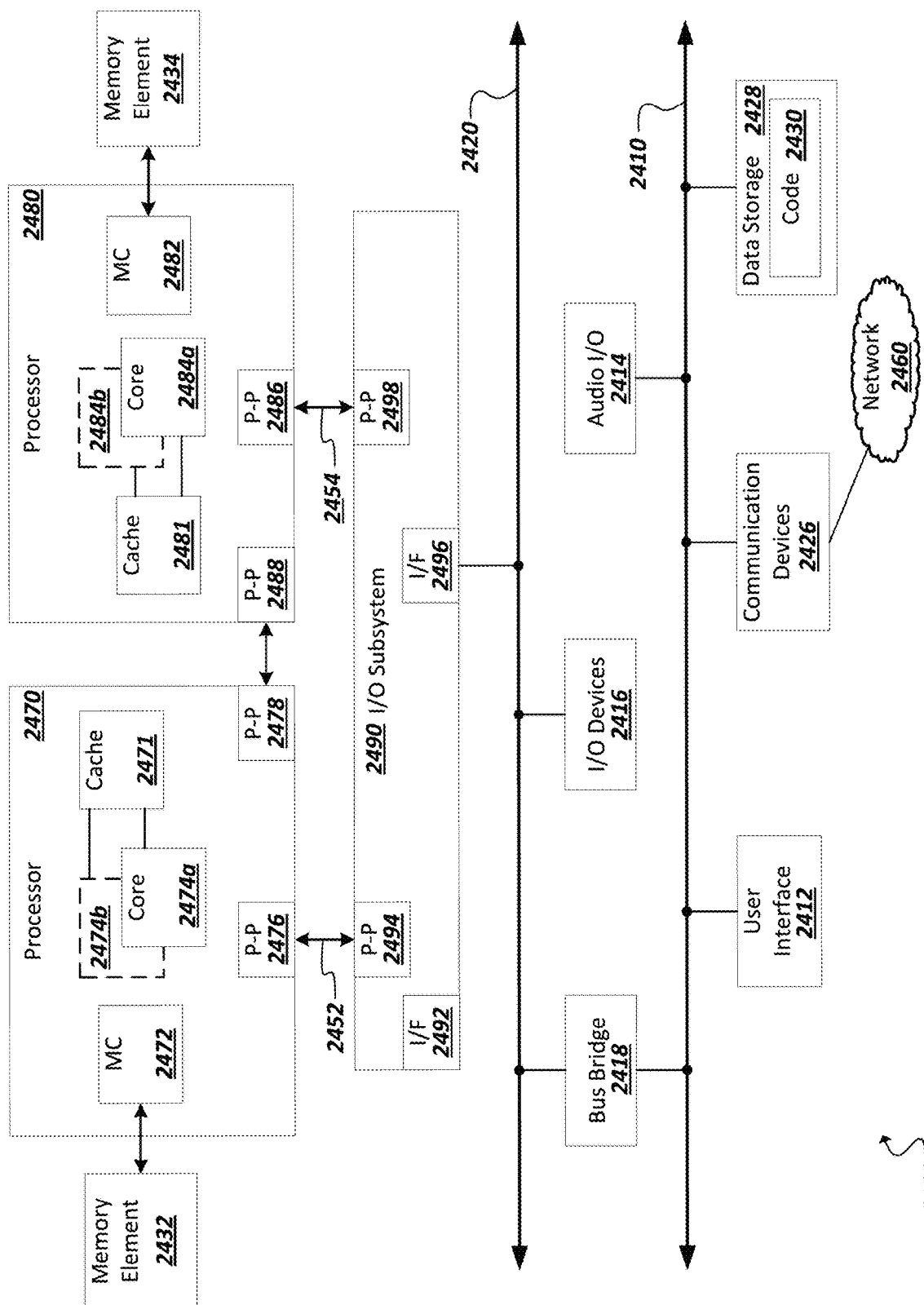
FIG. 24 illustrates a computing system that is arranged in a point-to-point (PtP) configuration according to an embodiment.

FIGS. 23-24 are block diagrams of example computer architectures that may be used in conjunction with embodiments disclosed herein. For example, in some embodiments, a processor cooling apparatus as described above may be used to cool a chip, such as a SoC, containing one or more aspects shown in FIGS. 23-24 (e.g., the processor core 2300 of FIG. 23 or one or both of processors 2470, 2480 of FIG. 24). In some embodiments, the computer architecture may be implemented within a computer system, such as a desktop computer system, a laptop (notebook) computer system, or a mobile computer system. Other computer architecture designs known in the art for processors and computing systems may also be used. Generally, suitable computer architectures for embodiments disclosed herein can include, but are not limited to, configurations illustrated in FIGS. 23-24.

FIG. 23 is an example illustration of a processor according to an embodiment. Processor 2300 is an example of a type of hardware device that can be used in connection with the implementations above. Processor 2300 may be any type of processor, such as a microprocessor, an embedded processor, a digital signal processor (DSP), a network processor, a multi-core processor, a single core processor, or other device to execute code. Although only one processor 2300 is illustrated in FIG. 23, a processing element may alternatively include more than one of processor 2300 illustrated in FIG. 23. Processor 2300 may be a single-threaded core or, for at least one embodiment, the processor 2300 may be multi-threaded in that it may include more than one hardware thread context (or "logical processor") per core.

FIG. 23 also illustrates a memory 2302 coupled to processor 2300 in accordance with an embodiment. Memory 2302 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 2300 can execute any type of instructions associated with algorithms, processes, or operations detailed herein. Generally, processor 2300 can transform an element or an article (e.g., data) from one state or thing to another state or thing.

Code 2304, which may be one or more instructions to be executed by processor 2300, may be stored in memory 2302, or may be stored in software, hardware, firmware, or any suitable combination thereof, or in any other internal or external component, device, element, or object where appropriate and based on particular needs. In one example, processor 2300 can follow a program sequence of instructions indicated by code 2304. Each instruction enters a front-end logic 2306 and is processed by one or more decoders 2308. The decoder may generate, as its output, a micro operation such as a fixed width micro operation in a predefined format, or may generate other instructions, microinstructions, or control signals that reflect the original code instruction. Front-end logic 2306 also includes register renaming logic 2310 and scheduling logic 2312, which generally allocate resources and queue the operation corresponding to the instruction for execution.

Processor 2300 can also include execution logic 2314 having a set of execution units 2316a, 2316b, 2316n, etc. Some embodiments may include a number of execution units dedicated to specific functions or sets of functions. Other embodiments may include only one execution unit or one execution unit that can perform a particular function. Execution logic 2314 performs the operations specified by code instructions.

After completion of execution of the operations specified by the code instructions, back-end logic 2318 can retire the instructions of code 2304. In one embodiment, processor 2300 allows out of order execution but requires in order retirement of instructions. Retirement logic 2320 may take a variety of known forms (e.g., re-order buffers or the like). In this manner, processor 2300 is transformed during execution of code 2304, at least in terms of the output generated by the decoder, hardware registers and tables utilized by register renaming logic 2310, and any registers (not shown) modified by execution logic 2314.

Although not shown in FIG. 23, a processing element may include other elements on a chip with processor 2300. For example, a processing element may include memory control logic along with processor 2300. The processing element may include I/O control logic and/or may include I/O control logic integrated with memory control logic. The processing element may also include one or more caches. In some embodiments, non-volatile memory (such as flash memory or fuses) may also be included on the chip with processor 2300.

FIG. 24 illustrates a computing system 2400 that is arranged in a point-to-point (PtP) configuration according to an embodiment. In particular, FIG. 24 shows a system where processors, memory, and input/output devices are interconnected by a number of point-to-point interfaces. Generally, one or more of the computing systems described herein may be configured in the same or similar manner as computing system 2300.

Processors 2470 and 2480 may also each include integrated memory controller logic (MC) 2472 and 2482 to communicate with memory elements 2432 and 2434. In alternative embodiments, memory controller logic 2472 and 2482 may be discrete logic separate from processors 2470 and 2480. Memory elements 2432 and/or 2434 may store various data to be used by processors 2470 and 2480 in achieving operations and functionality outlined herein.

Processors 2470 and 2480 may be any type of processor, such as those discussed in connection with other figures. Processors 2470 and 2480 may exchange data via a point-to-point (PtP) interface 2450 using point-to-point interface circuits 2478 and 2488, respectively. Processors 2470 and 2480 may each exchange data with a chipset 2490 via individual point-to-point interfaces 2452 and 2454 using point-to-point interface circuits 2476, 2486, 2494, and 2498. Chipset 2490 may also exchange data with a co-processor 2438, such as a high-performance graphics circuit, machine learning accelerator, or other co-processor 2438, via an interface 2439, which could be a PtP interface circuit. In alternative embodiments, any or all of the PtP links illustrated in FIG. 24 could be implemented as a multi-drop bus rather than a PtP link.

Chipset 2490 may be in communication with a bus 2420 via an interface circuit 2496. Bus 2420 may have one or more devices that communicate over it, such as a bus bridge 2418 and I/O devices 2416. Via a bus 2410, bus bridge 2418 may be in communication with other devices such as a user interface 2412 (such as a keyboard, mouse, touchscreen, or other input devices), communication devices 2426 (such as modems, network interface devices, or other types of communication devices that may communicate through a computer network 2460), audio I/O devices 2414, and/or a data storage device 2428. Data storage device 2428 may store code 2430, which may be executed by processors 2470 and/or 2480. In alternative embodiments, any portions of the bus architectures could be implemented with one or more PtP links.

The computer system depicted in FIG. 24 is a schematic illustration of an embodiment of a computing system that may be utilized to implement various embodiments discussed herein. It will be appreciated that various components of the system depicted in FIG. 24 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

In general, one aspect of the subject matter described in this specification can be embodied in methods and executed instructions that include or cause the actions of identifying a sample that includes software code, generating a control flow graph for each of a plurality of functions included in the sample, and identifying, in each of the functions, features corresponding to instances of a set of control flow fragment types. The identified features can be used to generate a feature set for the sample from the identified features These and other embodiments can each optionally include one or more of the following features. The features identified for each of the functions can be combined to generate a consolidated string for the sample and the feature set can be generated from the consolidated string. A string can be generated for each of the functions, each string describing the respective features identified for the function. Combining the features can include identifying a call in a particular one of the plurality of functions to another one of the plurality of functions and replacing a portion of the string of the particular function referencing the other function with contents of the string of the other function. Identifying the features can include abstracting each of the strings of the functions such that only features of the set of control flow fragment types are described in the strings. The set of control flow fragment types can include memory accesses by the function and function calls by the function. Identifying the features can include identifying instances of memory accesses by each of the functions and identifying instances of function calls by each of the functions. The feature set can identify each of the features identified for each of the functions. The feature set can be an n-graph.

Further, these and other embodiments can each optionally include one or more of the following features. The feature set can be provided for use in classifying the sample. For instance, classifying the sample can include clustering the sample with other samples based on corresponding features of the samples. Classifying the sample can further include determining a set of features relevant to a cluster of samples. Classifying the sample can also include determining whether to classify the sample as malware and/or determining whether the sample is likely one of one or more families of malware. Identifying the features can include abstracting each of the control flow graphs such that only features of the set of control flow fragment types are described in the control flow graphs. A plurality of samples can be received, including the sample. In some cases, the plurality of samples can be received from a plurality of sources. The feature set can identify a subset of features identified in the control flow graphs of the functions of the sample. The subset of features can correspond to memory accesses and function calls in the sample code.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. It will be understood that certain examples may be combined with certain other examples, in certain embodiments.

Example 1 includes a method comprising: extruding a metal through a feeder plate and an extrusion die to form an apparatus having a heat pipe portion comprising at least one heat pipe and flange portions extending radially and in opposite directions from an exterior surface of the heat pipe portion; removing one or more areas of the flange portions from the extruded apparatus; sealing the heat pipe portion of the extruded apparatus; and compressing the heat pipe portion in a direction orthogonal to the radial direction of the flange portions to reduce its thickness.

Example 2 includes the subject matter of Example 1 and/or other Example(s), and optionally, further comprising bending the heat pipe portion of the extruded apparatus in a location at which flange portions were removed.

Example 3 includes the subject matter of Example 1 and/or other Example(s), and optionally, further comprising cutting and stamping the remaining flange portions to form attachment mechanisms.

Example 4 includes the subject matter of Example 1 and/or other Example(s), and optionally, wherein the heat pipe portion has one of a stadium cross-sectional geometry, an oval cross-sectional geometry, or a circular cross-sectional geometry.

Example 5 includes the subject matter of Example 1 and/or other Example(s), and optionally, wherein a cross-sectional thickness of the flange portions is constant.

Example 6 includes the subject matter of Example 1 and/or other Example(s), and optionally, wherein a cross-sectional thickness of the flange portions is tapered.

Example 7 includes the subject matter of Example 1 and/or other Example(s), and optionally, wherein the flange portions of the extruded apparatus comprise a set of fins extending outward from an exterior surface.

Example 8 includes the subject matter of Example 1 and/or other Example(s), and optionally, wherein a cross-sectional centerline of the heat pipe portion is offset from a cross-sectional centerline of the flange portions.

Example 9 includes the subject matter of Example 1 and/or other Example(s), and optionally, wherein a bottom wall thickness of the heat pipe portion is greater than a top wall thickness of the heat pipe portion.

Example 10 includes the subject matter of Example 1 and/or other Example(s), and optionally, wherein the heat pipe portion comprises multiple heat pipes and connection flanges between the heat pipes.

Example 11 includes the subject matter of Example 10 and/or other Example(s), and optionally, wherein a cross-sectional thickness of the connection flanges is greater than a thickness of the flange portions.

Example 12 includes the subject matter of Example 1 and/or other Example(s), and optionally, wherein extruding the metal comprises using a variable geometry extrusion process.

Example 13 includes a product formed by the process comprising: extruding a metal through a feeder plate and an extrusion die to form an apparatus having a heat pipe portion and flange portions extending radially and in opposite directions from an exterior surface of the heat pipe portion; removing one or more areas of the flange portions from the extruded apparatus; sealing the heat pipe portion of the extruded apparatus; and compressing the heat pipe portion in a direction orthogonal to the radial direction of the flange portions to reduce its thickness.

Example 14 includes the subject matter of Example 13 and/or other Example(s), and optionally, wherein the process further comprises bending the heat pipe portion of the extruded apparatus in a location at which flange portions were removed.

Example 15 includes the subject matter of Example 13 and/or other Example(s), and optionally, wherein the process further comprises cutting and stamping the remaining flange portions to form attachment mechanisms.

Example 16 includes a cooling apparatus, comprising: a heat pipe portion comprising at least one heat pipe; and flange portions extending radially and in opposite directions from an exterior surface of the heat pipe portion; wherein the heat pipe portion and flange portions are extrusion formed from the same material.

Example 17 includes the subject matter of Example 16 and/or other Example(s), and optionally, wherein a cross-sectional thickness of the flange portions is constant.

Example 18 includes the subject matter of Example 16 and/or other Example(s), and optionally, wherein a cross-sectional thickness of the flange portions is tapered.

Example 19 includes the subject matter of Example 16 and/or other Example(s), and optionally, wherein the flange portions comprise a set of fins extending outward from an exterior surface.

Example 20 includes the subject matter of Example 16 and/or other Example(s), and optionally, wherein the flange portions are formed to function as leaf spring mechanisms.

Example 21 includes the subject matter of Example 16 and/or other Example(s), and optionally, wherein a bottom wall thickness of the heat pipe portion is greater than a top wall thickness of the heat pipe portion.

Example 22 includes a system comprising: a processor; and a cooling apparatus positioned proximate to the processor to absorb heat emitted from the processor, the cooling apparatus comprising: a heat pipe portion comprising at least one heat pipe; and flange portions extending radially and in opposite directions from an exterior surface of the heat pipe portion; wherein the heat pipe portion and flange portions are extrusion formed from the same material.

Example 23 includes the subject matter of Example 22 and/or other Example(s), and optionally, further comprising a motherboard coupled to the processor, wherein the flange portions of the cooling apparatus comprise mechanisms for coupling the cooling apparatus to the motherboard.

Example 24 includes the subject matter of Example 22 and/or other Example(s), and optionally, wherein the processor is one of a central processing unit and a graphics processing unit.

Example 25 includes the subject matter of Example 22 and/or other Example(s), and optionally, wherein the system is a laptop computer.

Example 26 is a method including: extruding a metal through a feeder plate and an extrusion die to form a heat pipe component including a length of pipe and a flange extending outward from the pipe along the length of the pipe; removing a section of the flange from the extruded heat pipe component; sealing the pipe of the extruded heat pipe component; and compressing the pipe to reduce its thickness.

Example 27 includes the subject matter of Example 26, further including bending the pipe in a location corresponding to the removed section of the flange.

Example 28 includes the subject matter of any one of Examples 26-27, where a flange portion remains following removal of the section of the flange, and the method further includes forming the flange portion into an attachment bracket, where the attachment bracket is adapted to couple the heat pipe component to a computer.

Example 29 includes the subject matter of Example 28, where forming the flange portion into the attachment bracket includes one or more of cutting the flange portion, bending the flange portion, or stamping the flange portion.

Example 30 includes the subject matter of any one of Examples 28-29, where the attachment bracket includes a leaf spring.

Example 31 includes the subject matter of any one of Examples 26-30, where the pipe has one of a stadium cross-sectional geometry, an oval cross-sectional geometry, or a circular cross-sectional geometry.

Example 32 includes the subject matter of any one of Examples 26-31, where a cross-sectional thickness of the flange is uniform.

Example 33 includes the subject matter of any one of Examples 26-32, where a cross-sectional thickness of the flange is tapered.

Example 34 includes the subject matter of any one of Examples 26-33, further including adding liquid to the interior of the pipe prior to sealing the pipe.

Example 35 includes the subject matter of any one of Examples 26-34, where a bottom wall thickness of the pipe is greater than a top wall thickness of the pipe.

Example 36 includes the subject matter of any one of Examples 26-35, where the heat pipe component includes a plurality of connected pipes, and the plurality of connected pipes includes the pipe.

Example 37 includes the subject matter of any one of Examples 26-36, where extruding the metal includes using a variable geometry extrusion process.

Example 38 is a product formed at least in part from a process including the method of any one of Examples 26-37.

Example 39 includes the subject matter of Example 38, where the product includes at least a portion of a heat pump.

Example 40 is a system including: a cooling apparatus for a computing system, where the cooling apparatus includes: a heat pipe portion including at least one heat pipe; and a flange portion integrally formed with the heat pipe portion through extrusion, where the flange portion is configured to couple the cooling apparatus to the computing system.

Example 41 includes the subject matter of Example 40, where the flange portions are formed to function as leaf spring mechanisms.

Example 42 includes the subject matter of any one of Examples 40-41, further including a hardware component to be cooled using the cooling apparatus.

Example 43 includes the subject matter of Example 42, where the cooling apparatus further includes a cold plate positioned to correspond with the hardware component.

Example 44 includes the subject matter of any one of Examples 40-43, further including a motherboard, and the flange is configured to couple the cooling apparatus to the motherboard.

Example 45 includes the subject matter of Example 44, further including the computing system, the computing system includes a personal computing device, and the motherboard functions as the motherboard of the personal computing device.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A method comprising:
    extruding a metal through a feeder plate and an extrusion die to form a heat pipe component comprising a length of pipe and a flange extending outward from the pipe along the length of the pipe;
    removing a section of the flange from the extruded heat pipe component to form an attachment bracket, wherein a flange portion remains following removal of the section of the flange, and the attachment bracket comprises the flange portion;
    sealing the pipe of the extruded heat pipe component;
    bending the pipe at a section of the pipe corresponding to the removed section of the flange; and
    compressing the pipe to reduce the height of the heat pipe to less than 3 mm, wherein the heat pipe is configured to be attached to a computing device using the attachment bracket.

2. The method of claim 1, further comprising bending the pipe in a location corresponding to the removed section of the flange.

3. The method of claim 1, wherein forming the flange portion into the attachment bracket further comprises one or more of cutting the flange portion, bending the flange portion, or stamping the flange portion.

4. The method of claim 1, wherein the attachment bracket is formed to implement a leaf spring.

5. The method of claim 1, wherein the pipe has one of a stadium cross-sectional geometry, an oval cross-sectional geometry, or a circular cross-sectional geometry.

6. The method of claim 1, wherein a cross-sectional thickness of the flange is uniform.

7. The method of claim 1, wherein a cross-sectional thickness of the flange is tapered.

8. The method of claim 1, further comprising adding liquid to the interior of the pipe prior to sealing the pipe.

9. The method of claim 1, wherein a bottom wall thickness of the pipe is greater than a top wall thickness of the pipe.

10. The method of claim 1, wherein the heat pipe component comprises a plurality of connected pipes, and the plurality of connected pipes comprises the pipe.

11. The method of claim 1, wherein extruding the metal comprises using a variable geometry extrusion process.

12. A product formed by the process comprising:
 extruding a metal through a feeder plate and an extrusion die to form a heat pipe component comprising a length of pipe and a flange extending outward from the pipe along the length of the pipe;
 removing a section of the flange from the extruded heat pipe component to form at least a portion of an attachment bracket, wherein a flange portion remains following removal of the section of the flange, and the attachment bracket comprises the flange portion;
 sealing the pipe of the extruded heat pipe component;
 bending the pipe at a section of the pipe corresponding to the removed section of the flange; and
 compressing the pipe to reduce the height of the heat pipe to less than 3 mm, wherein the heat pipe is configured to be attached to a computing device using the attachment bracket.

13. The product of claim 12, wherein the pipe is bent at the section of the pipe corresponding to the removed section of the flange to at least partially align the pipe with a heat source the computing device.

14. The product of claim 12, wherein the process further comprises forming the attachment bracket from the flange portion, wherein the attachment bracket implements a leaf spring.

\* \* \* \* \*